(12) United States Patent
Burak

(10) Patent No.: US 9,691,963 B2
(45) Date of Patent: Jun. 27, 2017

(54) CAPACITIVE COUPLED RESONATOR AND FILTER DEVICE WITH COMB ELECTRODES AND SUPPORT PILLARS SEPARATING PIEZOELECTRIC LAYER

(71) Applicant: Avago Technologies General IP (Singapore) Pte. Ltd., Singapore (SG)

(72) Inventor: Dariusz Burak, Fort Collins, CO (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 0 days.

(21) Appl. No.: 14/954,269

(22) Filed: Nov. 30, 2015

(65) Prior Publication Data

US 2016/0087187 A1 Mar. 24, 2016

Related U.S. Application Data

(63) Continuation-in-part of application No. 14/290,777, filed on May 29, 2014.

(51) Int. Cl.
  *H03H 9/02* (2006.01)
  *H01L 41/047* (2006.01)
  *H01L 41/053* (2006.01)
  *H03H 9/17* (2006.01)

(52) U.S. Cl.
  CPC .......... *H01L 41/047* (2013.01); *H01L 41/053* (2013.01); *H03H 9/02228* (2013.01); *H03H 9/173* (2013.01); *H03H 9/175* (2013.01)

(58) Field of Classification Search
  CPC .... H03H 9/02228; H03H 9/173; H03H 9/175; H01L 41/047; H01L 41/053
  USPC .................................................. 333/186, 187
  See application file for complete search history.

(56) References Cited

U.S. PATENT DOCUMENTS

| | | |
|---|---|---|
| 5,587,620 A | 12/1996 | Ruby et al. |
| 5,617,065 A | 4/1997 | Dydyk |
| 5,873,153 A | 2/1999 | Ruby et al. |
| 6,107,721 A | 8/2000 | Lakin |
| 6,384,697 B1 | 5/2002 | Ruby |
| 6,507,983 B1 | 1/2003 | Ruby et al. |
| 6,548,943 B2 | 4/2003 | Kaitila et al. |

(Continued)

OTHER PUBLICATIONS

Co-pending U.S. Appl. No. 13/955,774, filed Jul. 31, 2013.

(Continued)

*Primary Examiner* — Robert Pascal
*Assistant Examiner* — Jorge Salazar, Jr.

(57) ABSTRACT

A capacitive coupled resonator device includes a substrate, a bottom electrode, a piezoelectric layer, a top electrode, and at least one set of support pillars positioned between the piezoelectric layer and the top electrode and/or between the piezoelectric layer and the bottom electrode. The top electrode includes a first top comb electrode having a first top bus bar and first top fingers extending in a first direction from the first top bus bar, and a second top comb electrode having a second top bus bar and second top fingers extending in a second direction from the second top bus bar, the second direction being substantially opposite the first direction such that the first and second top fingers form a top interleaving pattern. The at least one set of support pillars separates at least one of the top and bottom electrodes from the piezoelectric layer, respectively, thereby defining corresponding air-gaps.

21 Claims, 26 Drawing Sheets

(56) References Cited

U.S. PATENT DOCUMENTS

| | | | |
|---|---|---|---|
| 6,635,519 B2 * | 10/2003 | Barber | H03H 3/04 257/414 |
| 7,275,292 B2 | 10/2007 | Ruby et al. | |
| 7,280,007 B2 | 10/2007 | Feng et al. | |
| 7,358,831 B2 | 4/2008 | Larson, III et al. | |
| 7,388,454 B2 | 6/2008 | Ruby et al. | |
| 7,629,865 B2 | 12/2009 | Ruby | |
| 8,816,567 B2 | 8/2014 | Zuo et al. | |
| 2007/0205850 A1 | 9/2007 | Jamneala et al. | |
| 2008/0258842 A1 | 10/2008 | Ruby et al. | |
| 2010/0039000 A1 | 2/2010 | Milson et al. | |
| 2010/0327697 A1 | 12/2010 | Choy et al. | |
| 2010/0327994 A1 | 12/2010 | Choy et al. | |
| 2012/0050236 A1 * | 3/2012 | Lo | H01P 1/2135 345/204 |
| 2012/0218057 A1 | 8/2012 | Burak et al. | |
| 2013/0106534 A1 | 5/2013 | Burak et al. | |
| 2013/0140958 A1 | 6/2013 | Chen et al. | |
| 2013/0235001 A1 | 9/2013 | Yun et al. | |
| 2014/0118088 A1 | 5/2014 | Burak et al. | |
| 2014/0118091 A1 | 5/2014 | Burak et al. | |
| 2014/0125203 A1 | 5/2014 | Choy et al. | |
| 2015/0270826 A1 | 9/2015 | Burak | |

OTHER PUBLICATIONS

Co-pending U.S. Appl. No. 13/662,425, filed Oct. 27, 2012.
Co-pending U.S. Appl. No. 13/662,460, filed Oct. 27, 2012.
Co-pending U.S. Appl. No. 14/192,599, filed Feb. 27, 2014.
Co-pending U.S. Appl. No. 13/658,024, filed Oct. 23, 2012.
Co-pending U.S. Appl. No. 13/654,718, filed Oct. 18, 2012.
Co-pending U.S. Appl. No. 13/781,491, filed Feb. 28, 2013.
Co-pending U.S. Appl. No. 14/225,710, filed Mar. 26, 2014.
Antonio Qualtieri et al., "Nonclassical emission from single colloidal nanocrystals in a microcavity: a route towards room temperature single photon sources", New J. Phys. 11 (2009) 033025, pp. 1-5.
Tazzoli et al. "Ovenized High Frequency Oscillators Based on Aluminum Nitride Contour-Mode MEMS Resonators", IEEE, Dec. 2011, pp. 1-4.
Zuo et al. "Channel-Select RF MEMS Filters Based on Self-Coupled AlN Contour-Mode Piezoelectric Resonators", IEEE, Oct. 2007, pp. 1156-1159.
Stephanou et al. "GHZ Contour Extensional Mode Aluminum Nitride MEMS Resonators", IEEE, Oct. 2006, pp. 2401-2404.
Office Action dated Nov. 18, 2016 from U.S. Appl. No. 14/954,251.

* cited by examiner

CAPACITIVE COUPLED RESONATOR AND FILTER DEVICE WITH COMB ELECTRODES AND SUPPORT PILLARS SEPARATING PIEZOELECTRIC LAYER

PRIORITY

The present application is a continuation-in-part (CIP) application under 37 C.F.R. §1.53(b) of commonly owned U.S. patent application Ser. No. 14/290,777, entitled "Capacitive Coupled Resonator Device with Air-Gap Separating Electrode and Piezoelectric Layer," filed on May 29, 2014 naming Dariusz Burak et al. as inventors (referred to as "parent application"). (issued as U.S. Pat. No. 9,608,594 on Mar. 28, 2017). Priority to the parent application is claimed under 35 U.S.C. §120 and the disclosure of the parent application is hereby incorporated by reference in its entirety for all purposes.

BACKGROUND

Acoustic resonators can be used to implement signal processing functions in various electronic applications. For example, some cellular phones and other communication devices use acoustic resonators to implement frequency filters for transmitted and/or received signals. Several different types of acoustic resonators can be used according to different applications, with examples including bulk acoustic wave (BAW) resonators such as thin film bulk acoustic resonators (FBARs), stacked bulk acoustic resonators (SBARs), double bulk acoustic resonators (DBARs), contour mode resonators (CMRs), and solidly mounted resonators (SMRs). An FBAR, for example, includes a piezoelectric layer between a bottom (first) electrode and a top (second) electrode over a cavity. BAW resonators may be used in a wide variety of electronic applications and devices, such as cellular telephones, personal digital assistants (PDAs), electronic gaming devices, laptop computers and other portable communications devices. For example, FBARs operating at frequencies close to their fundamental resonance frequencies may be used as a key component of radio frequency (RF) filters and duplexers in mobile devices, including ladder filters, for example. Other types of filters formed of acoustic resonators include laterally coupled resonator filters (LCRFs) and coupled resonator filters (CRFs), for example.

An acoustic resonator typically comprises a layer of piezoelectric material applied to a top surface of a bottom electrode, and a top plate electrode applied to a top surface of the piezoelectric material, resulting in a structure referred to as an acoustic stack. Where an input electrical signal is applied between the electrodes, reciprocal or inverse piezoelectric effect causes the acoustic stack to mechanically expand or contract depending on the polarization of the piezoelectric material. As the input electrical signal varies over time, expansion and contraction of the acoustic stack produces acoustic waves that propagate through the acoustic resonator in various directions and are converted into an output electrical signal by the piezoelectric effect. Some of the acoustic waves achieve resonance across the acoustic stack, with the resonant frequency being determined by factors such as the materials, dimensions, and operating conditions of the acoustic stack. These and other mechanical characteristics of the acoustic resonator determine its frequency response.

With respect to LCRFs, in particular, they each typically include a ground plane, a piezoelectric layer and a set of interdigitated top comb electrodes having interlaced comb-like fingers. Generally, an electrical signal is applied to one of the top comb electrodes of an LCRF, which excites Mason (or piston) mode under that electrode. Generally, Mason mode undergoes scattering at the electrode edges and produces spurious modes in the fingers and corresponding gaps between the fingers. The spurious modes in the gaps propagate to the fingers of the other top comb electrode, exciting motion. Voltage is generated by the excited motion, which is picked up as a transmitted signal.

There a number of advantages to using an LCRF over other types of acoustic resonator filters, such as ladder filters formed of series and shunt resonators (e.g., FBARs) interconnected in a ladder-type structure. For example, the process of fabricating an LCRF is relatively simple, in that conventionally it essentially involves only top electrode patterning. Also, there may be no need for mass-loading of various ones of the series and shunt resonators, and there may be a reduction in physical space required for the filter. However, LCRFs are generally difficult to design with regard to specific pass-bands. In comparison, a typical ladder filter requires only one-dimensional Mason model simulations, whereas an LCRF requires two-dimension or even three-dimensional finite element method (FEM) model simulations. Also, spurious pass-bands may be present in various spectral regions. The embodiments described herein address these and other issues.

BRIEF DESCRIPTION OF THE DRAWINGS

The illustrative embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements.

DETAILED DESCRIPTION

Figure 1:
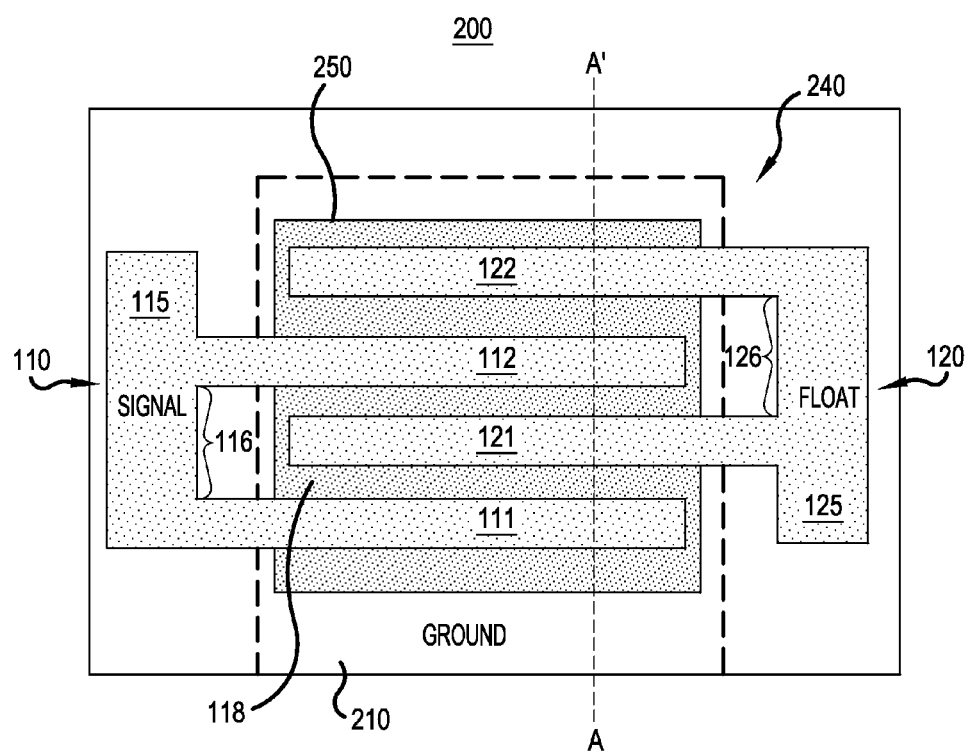
FIG. 1 is a top plan view of a single-ended laterally coupled resonator filter (LCRF) device with at least one support frame, according to a representative embodiment.

In the following detailed description, for purposes of explanation and not limitation, example embodiments disclosing specific details are set forth in order to provide a thorough understanding of the present teachings. However, it will be apparent to one of ordinary skill in the art having the benefit of the present disclosure that other embodiments according to the present teachings that depart from the specific details disclosed herein remain within the scope of the appended claims. Moreover, descriptions of well-known apparatuses and methods may be omitted so as to not obscure the description of the example embodiments. Such methods and apparatuses are clearly within the scope of the present teachings.

The terminology used herein is for purposes of describing particular embodiments only, and is not intended to be limiting. The defined terms are in addition to the technical, scientific, or ordinary meanings of the defined terms as commonly understood and accepted in the relevant context.

The terms "a", "an" and "the" include both singular and plural referents, unless the context clearly dictates otherwise. Thus, for example, "a device" includes one device and plural devices. The terms "substantial" or "substantially" mean to within acceptable limits or degree. The term "approximately" means to within an acceptable limit or amount to one of ordinary skill in the art. Relative terms, such as "above," "below," "top," "bottom," "upper" and "lower" may be used to describe the various elements" relationships to one another, as illustrated in the accompanying drawings. These relative terms are intended to encompass different orientations of the device and/or elements in addition to the orientation depicted in the drawings. For example, if the device were inverted with respect to the view in the drawings, an element described as "above" another element, for example, would now be below that element. Where a first device is said to be connected or coupled to a second device, this encompasses examples where one or more intermediate devices may be employed to connect the two devices to each other. In contrast, where a first device is said to be directly connected or directly coupled to a second device, this encompasses examples where the two devices are connected together without any intervening devices other than electrical connectors (e.g., wires, bonding materials, etc.).

Various electronic devices are operating at higher frequencies, requiring incorporation of acoustic resonators (e.g., as filters) with higher resonance frequencies (e.g., greater than or equal to about 3.5 GHz). Various embodiments of acoustic resonator devices described herein address problems associated with high resonance frequencies, some of which are identified above, by inserting one or more relatively thin air-gaps between one or both of the electrodes (or metal layers) and the piezoelectric layer, respectively, where at least one of the electrodes comprises interdigitated comb electrodes, thereby decoupling electrical excitation from acoustic propagation. The acoustic resonator devices include laterally coupled resonator filter (LCRF) devices and contour mode resonator (CMR) devices. Structurally, LCRF and CMR device are very similar, but differ in electrode connectivity. Electrically, there are two basic types of LCRFs, single-ended and differential LCRF devices; and two basic types of CMRs, lateral-field-excitation (LFE) and thickness-field-excitation (TFE) CMR devices.

Notably, the air-gaps tend to reduce the electromechanical coupling coefficient $Kt^2$ of the piezoelectric layer. Thus, according to various embodiments, the piezoelectric layer may be doped with one or more rare earth elements (e.g., up to about 10 atomic percent scandium), to increase the electrometrical coupling coefficient $Kt^2$, as discussed below. The thickness of the piezoelectric layer may be increased, resulting in larger, more electrically robust acoustic resonator devices.

In representative embodiments, a capacitive coupled resonator device includes a substrate, a bottom electrode disposed over the substrate, a piezoelectric layer disposed over the bottom electrode, a top electrode disposed over the piezoelectric layer, and at least one support frame positioned between the piezoelectric layer and the top electrode and/or positioned between the piezoelectric layer and the bottom electrode. The top electrode includes a first top comb electrode having a first top bus bar and multiple first top fingers extending in a first direction from the first top bus bar, and a second top comb electrode having a second top bus bar and multiple second top fingers extending in a second direction from the second top bus bar, the second direction being substantially opposite to the first direction such that the first and second top fingers form a top interleaving pattern. The at least one support frame includes air-gaps separating at least one of the top electrode and the bottom electrode from the piezoelectric layer, respectively.

In other representative embodiments, a capacitive coupled resonator device includes substrate, a bottom electrode disposed over the substrate, a piezoelectric layer disposed over the bottom electrode, a top electrode disposed over the piezoelectric layer, and at least one set of support pillars positioned between the piezoelectric layer and the top electrode and/or positioned between the piezoelectric layer and the bottom electrode. The top electrode includes a first top comb electrode having a first top bus bar and multiple first top fingers extending in a first direction from the first top bus bar, and a second top comb electrode having a second top bus bar and multiple second top fingers extending in a second direction from the second top bus bar, the second direction being substantially opposite to the first direction such that the first and second top fingers form a top interleaving pattern. The at least one set of support pillars separate at least one of the top electrode and the bottom electrode from the piezoelectric layer, respectively, thereby defining corresponding air-gaps.

The described embodiments may provide several potential benefits relative to conventional technologies. For example, representative embodiment of acoustic filters described below may be produced with a smaller die size compared with conventional acoustic filters. This results in reduction of a number of factors, such as footprint, power consumption, and cost. Certain embodiments can also be used to efficiently implement common circuit functions, such as single-ended to differential signal conversion or impedance transformation. In addition, certain embodiments can be used to implement electrical components for wide band applications. Finally, the above and other benefits can be achieved in certain embodiments by a relatively simple structure and corresponding fabrication process, as will be apparent from the following description.

FIG. 1 is a top plan view of a laterally coupled resonator filter (LCRF) device with at least one support frame, according to a representative embodiment, and FIGS. 2A-2D are cross-sectional views of the LCRF in FIG. 1 taken along a line A-A' according to different embodiments. More particularly, FIG. 1 depicts LCRF device 200, which is a single-ended LRCF (as opposed a differential LCRF, discussed below). The cross-sectional views correspond to different variations of the single-ended LCRF device 200, respectively, as LCRF devices 200A-200D, which may be referred to as capacitive coupled electrodes (CCEs). The LCRF devices 200A-200D have many of the same features, so a repetitive description of these features may be omitted in an effort to avoid redundancy.

Referring to FIG. 1, LCRF device 200 includes a top electrode 240, which may be referred to as a contour electrode, comprising a first top comb electrode 110 and second top comb electrode 120. The first top comb electrode 110 includes a first top bus bar 115 and multiple first top comb extensions or first top comb-like fingers, indicated by representative first top fingers 111 and 112, separated by first space 116. The first top fingers 111 and 112 extend in a first direction from the first top bus bar 115 (e.g., left to right in the illustrative orientation). The second top comb electrode 120 similarly includes a second top bus bar 125 and multiple second top comb extensions or top comb-like fingers, indicated by representative second top fingers 121 and 122, separated by second space 126. The second top fingers 121 and 122 extend in a second direction, opposite the first direction, from the second top bus bar 125 (e.g., right to left in the illustrative orientation). The first top comb electrode 110 is a signal electrode to which an electrical signal is applied, and the second top comb electrode 120 is a floating electrode providing an output for the electrical signal.

The top electrode 240 is interdigitated in that the first top fingers 111 and 112 of the first top comb electrode 110 extend into the second space 126 between the second top fingers 121 and 122 of the second top comb electrode 120, and the second top fingers 121 and 122 of the second top comb electrode 120 extend into the first space 116 between the first top fingers 111 and 112 of the first top comb electrode 110. This arrangement forms a top interleaving pattern of the LCRF device 200. The alternating first and second top fingers 111, 121, 112 and 122 are likewise separated by spaces or gaps 118, respectively. In the depicted embodiment, a top surface of a support frame 250 (discussed below) is visible through the gaps 118. However, in alternative embodiments, the support frame 250 is not present (e.g., as shown in FIG. 2B), in which case a top surface of a piezoelectric layer 230 (discussed below) would be visible through the gaps 118. Also, in the depicted embodiment, the edges of the first top fingers 111, 112 and the second top fingers 121, 122 are parallel to one another. This includes the side edges of the first top fingers 111, 112 and the second top fingers 121, 122 that extend lengthwise along first and second directions, respectively, as well as the end edges that are perpendicular to the side edges, respectively.

FIGS. 2A to 2D are cross-sectional diagrams, taken along line A-A' of FIG. 1, illustrating LCRF devices, according to representative embodiments. Each of the LCRF devices shown in FIGS. 2A to 2D includes a single bottom electrode, thus depicting a single-ended LCRF configuration.

Figure 2A:
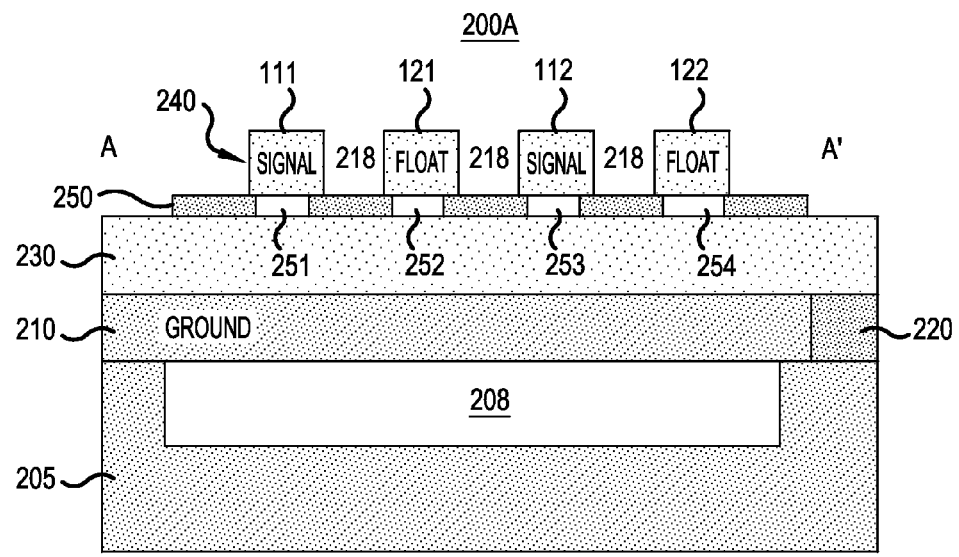
FIGS. 2A-2D are cross-sectional diagrams, taken along line A-A' of FIG. 1, illustrating the single-ended LCRF device, according to various representative embodiments.
Figure 2B:
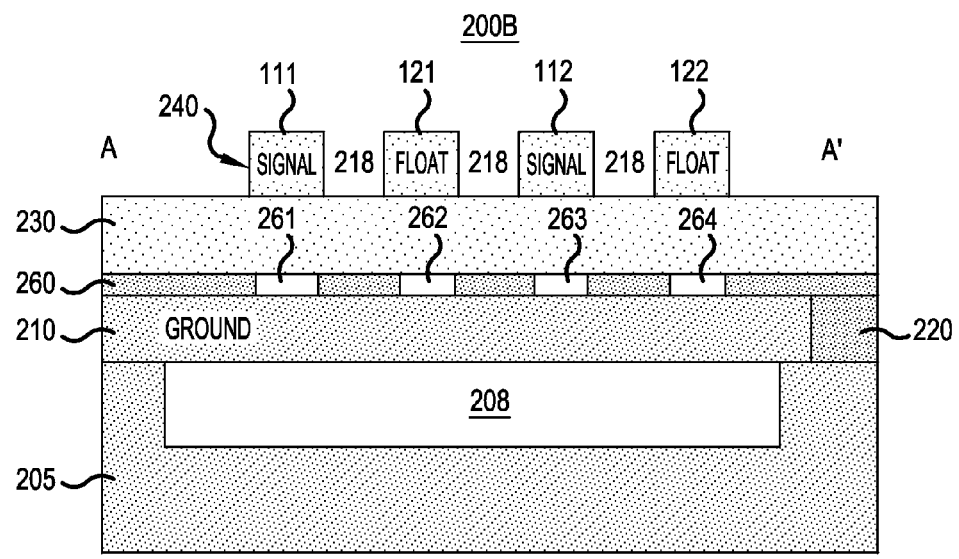

Referring to FIG. 2A, LCRF device 200A includes a substrate 205 defining a cavity 208 (e.g., air cavity), which serves as an acoustic reflector. The LCRF device 200A further includes a bottom electrode 210 disposed on the substrate 205 over the cavity 208, a planarization layer 220 (optional) disposed adjacent to bottom electrode 210 on the substrate 205, a piezoelectric layer 230 disposed on the bottom electrode 210 and the planarization layer 220, and a top (contour) electrode 240 disposed over the piezoelectric layer 230. In addition, the LCRF device 200A includes a support frame 250 positioned between the piezoelectric layer 230 and the top electrode 240. The support frame 250 defines air-gaps, indicated by representative air-gaps 251, 252, 253 and 254, separating the top electrode 240 from and the piezoelectric layer 230.

More particularly, the support frame 250 is configured such that the air-gaps 251-254 are arranged beneath the first top finger 111, second top finger 121, the first top finger 112 and the second top finger 122, respectively, creating an opening of air between a top surface of the piezoelectric layer 230 and a bottom surface of each of the first top fingers 111, 112 and the second top fingers 121, 122. The air-gaps 251-254, together with the cavity 208, enable movement (or vibration) of the piezoelectric layer 230 in a vertical (as opposed to lateral) direction. More specifically, the air-gaps 251-254 allow electrical excitation of the piezoelectric layer 230 without a mass-loading effect associated with the metal layers forming top electrode 240. Collectively, bottom electrode 210, the piezoelectric layer 230, and the top electrode 240 constitute an acoustic stack of the LCRF device 200A. Also, overlapping portions of the bottom electrode 210, the piezoelectric layer 230, the air-gaps 251-254 and the top electrode 240 over the cavity 208 define a main membrane region of the LCRF device 200A.

As stated above, the first top comb electrode 110 is a signal electrode to which an electrical signal is applied, and the second top comb electrode 120 is a floating electrode providing an output for the electrical signal. Therefore, as shown in FIG. 2A, the first top fingers 111 and 112 receive the input electrical signal, and the second top fingers 121 and 122 are floating. Meanwhile, the bottom electrode 210 is grounded (e.g., connected to a ground voltage). Also, although not shown, a passivation layer may be present on top of top electrode 240 (and in each embodiment discussed herein) with thickness sufficient to insulate all layers of the acoustic stack from the environment, including protection from moisture, corrosives, contaminants, debris and the like.

In various embodiments, the support frame 250 defining the air-gaps 251-254, is formed of a dielectric material, such as non-etchable borosilicate glass (NEBSG) or non-conductive silicon carbide (SiC). The dielectric material may be deposited on the top surface of the piezoelectric layer 230, then patterned and etched to provide the support frame 250 with openings corresponding to the air-gaps 251-254. The air-gaps 251-254 may be filled with sacrificial material, such as phosphosilicate glass (PSG), and planarized along with the support frame 250, using a chemical-mechanical polishing (CMP) process, for example. The top electrode 240 may then be deposited over the piezoelectric layer 230 and on the planarized top surface of the support frame 250 and the sacrificial material, which is subsequently removed to leave the air-gaps 251-254.

Notably, reference to the air-gaps 251-254 implies that they are "filled" with air. However, this terminology is used for the sake of convenience and is not intended to be limiting. That is, it is understood that the air-gaps 251-254 (as well as the other air-gaps identified herein) may constitute a vacuum, be filled with one or more gases other than air, or be filled with dielectric or metal material, to provide the desirably large acoustic impedance discontinuity depending on the specific implementation, without departing from the scope of the present teachings. The air-gaps 251-254 may have a height (in the vertical direction) less than or equal to about 1000 Å, for example, and in some embodiments, less than or equal to about 300 Å. However, thicker air-gaps may be incorporated, without departing from the scope of the present teachings. The above descriptions of the support frame 250 and corresponding air-gaps 251-254 equally apply to the other support frames (top and bottom) and corresponding air-gaps identified herein, and therefore may not be repeated.

Referring to FIG. 2B, LCRF device 200B includes the substrate 205 defining the cavity 208 (e.g., air cavity), the bottom electrode 210 disposed on the substrate 205 over the cavity 208, the planarization layer 220 (optional) disposed adjacent to bottom electrode 210 on the substrate 205, the piezoelectric layer 230 disposed over the bottom electrode 210 and the planarization layer 220, and the top electrode 240 disposed on the piezoelectric layer 230. The LCRF device 200B further includes a support frame 260 positioned between the piezoelectric layer 230 and the bottom electrode 210 (as well as the planarization layer 220). The support frame 260 defines air-gaps, indicated by representative air-gaps 261, 262, 263 and 264, separating the bottom electrode 210 from and the piezoelectric layer 230. More particularly, the support frame 260 is configured such that the air-gaps 261-264 are arranged beneath the first top finger 111, the second top finger 121, the first top finger 112 and the second top finger 122, respectively, although with the piezoelectric layer 230 in between. Each of the air-gaps 261-264 creates an opening of air between a bottom surface of the piezoelectric layer 230 and a top surface of the bottom electrode 210.

Again, the air-gaps 261-264, together with the cavity 208, enable movement (or vibration) of the piezoelectric layer 230 in a vertical (as opposed to lateral) direction. Notably, the location of the air-gaps 261-264 directly below the piezoelectric layer 230 and above the bottom electrode 210 makes the cavity 208 optional. This is because the air (or other gas(es) or vacuum, in certain configurations) in the air-gaps 261-264 will not transfer mechanical energy from the vibrating piezoelectric layer 230 to the bottom electrode 210. In other words, reflection from the bottom surface of piezoelectric layer 230 is substantially complete. Thus, there is no need to acoustically insulate the bottom electrode 210 from the substrate 205, e.g., by the additional cavity 208, because bottom electrode 210 is substantially not vibrating.

In various embodiments, the support frame 260 defining the air-gaps 261-264 is formed of a dielectric material, such as NEBSG or non-conductive SiC. The dielectric material may be deposited on the top surface of the ground bottom electrode 210 and the planarization layer 220, then patterned and etched to provide the support frame 260 with openings corresponding to the air-gaps 261-264. The air-gaps 261-264 may be filled with sacrificial material, such as PSG, and planarized along with the support frame 260, using a CMP process, for example. The piezoelectric layer 230 may then be deposited over the bottom electrode 210 and on the planarized top surface of the support frame 260 and the sacrificial material. The sacrificial material is subsequently removed to leave the air-gaps 261-264.

Figure 2C:
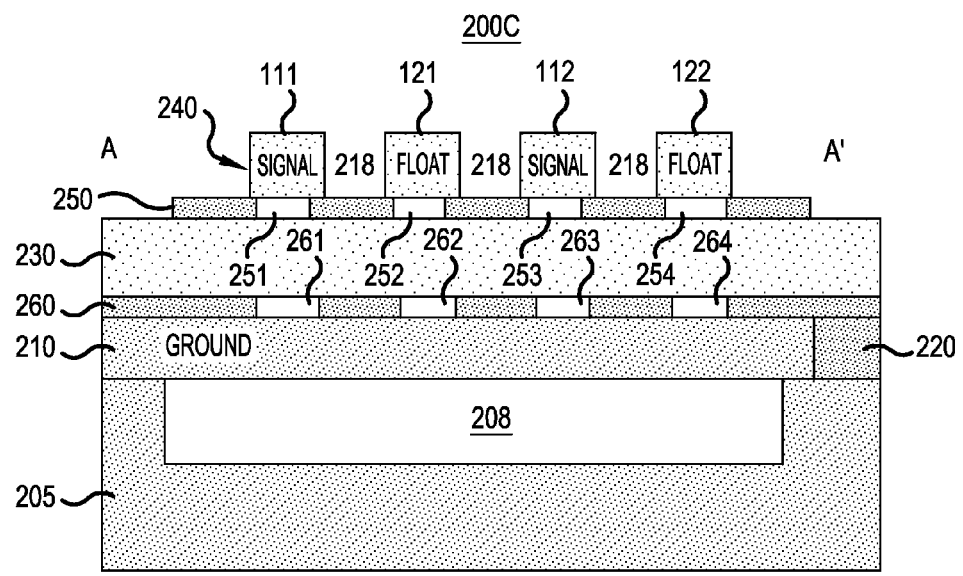

Referring to FIG. 2C, LCRF device 200C substantially combines the configurations of the single-ended LCRF devices 200A and 200B. That is, the LCRF device 200C includes both the support frame 250 positioned between the piezoelectric layer 230 and the top electrode 240, and the support frame 260 positioned between the piezoelectric layer 230 and the bottom electrode 210 (and the planarization layer 220). Again, the presence of the air-gaps 261-264 directly below the piezoelectric layer 230 and above the bottom electrode 210 makes the cavity 208 optional, regardless of the presence of the air-gaps 251-254.

Figure 2D:
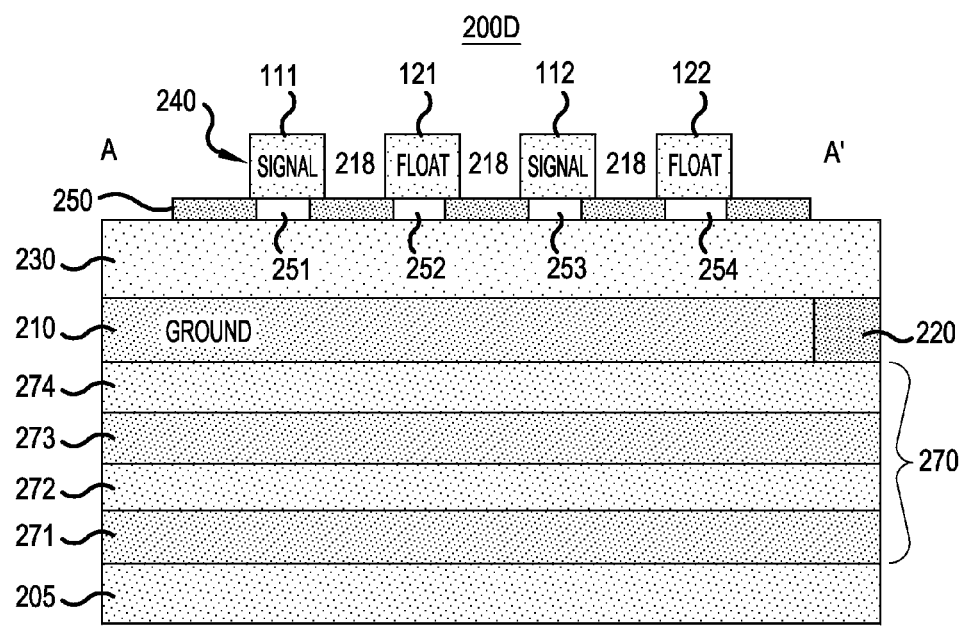

Referring to FIG. 2D, LCRF device 200D is substantially the same as LCRF device 200A, except that the acoustic reflector is implemented as an acoustic mirror, such as the representative Distributed Bragg Reflector (DBR) 270, as opposed to the cavity 208. In this configuration, the DBR 270 is disposed on the substrate 205, the bottom electrode 210 is disposed on the DBR 270, the planarization layer 220 (optional) is disposed adjacent to bottom electrode 210 on the DBR 270, the piezoelectric layer 230 is disposed on the bottom electrode 210 and the planarization layer 220, and the top electrode 240 is disposed over the piezoelectric layer 230. In addition, the LCRF device 200D includes the support frame 250 positioned between the piezoelectric layer 230 and the top electrode 240. The support frame 250 defines air-gaps, indicated by representative air-gaps 251, 252, 253 and 254, separating the top electrode 240 from and the piezoelectric layer, as discussed above with reference to FIG. 2A. The LCRF device 200D is therefore effectively a solidly mounted LCRF device. Of course, the DBR 270 may likewise be substituted for the cavity 208 in the LCRF devices 200B and 200C, without departing from the scope of the present teachings.

The DBR 270 includes pairs of acoustic impedance layers formed of materials having different acoustic impedances, where the layer of material having the lower acoustic impedance is stacked on the layer of material having the higher acoustic impedance. For example, in the depicted embodiment, the DBR 270 includes stacked acoustic impedance layers 271, 272, 273 and 274, where the impedance layers 271 and 273 may be formed of a relatively high acoustic impedance material, such as tungsten (W) or molybdenum (Mo), and acoustic impedance layers 272 and 274 may be formed of a material having relatively low acoustic impedance, such as silicon oxide ($SiO_x$), where x is an integer. Various illustrative fabrication techniques of acoustic mirrors are described by in U.S. Pat. No. 7,358,831 (Apr. 15, 2008), to Larson III, et al., which is hereby incorporated by reference in its entirety.

In the various embodiments, the substrate 205 may be formed of a material compatible with semiconductor processes, such as silicon (Si), gallium arsenide (GaAs), indium phosphide (InP), glass, sapphire, alumina, or the like, for example. The cavity 208 may be formed by etching a cavity in the substrate 205 and filling the etched cavity with a sacrificial material, such as PSG, for example, which is subsequently removed to leave an air space. Various illustrative fabrication techniques for an air cavity in a substrate are described by U.S. Pat. No. 7,345,410 (Mar. 18, 2008), to Grannen et al., which is hereby incorporated by reference in its entirety.

The bottom electrode 210 may be formed of one or more electrically conductive materials, such as various metals compatible with semiconductor processes, including tungsten (W), molybdenum (Mo), iridium (Ir), aluminum (Al), platinum (Pt), ruthenium (Ru), niobium (Nb), and/or hafnium (Hf), for example. In various configurations, the bottom electrode 210 may be formed of two or more layers of electrically conductive materials, which may by the same as or different from one another. Likewise, the top electrode 240 may be formed of electrically conductive materials, such as various metals compatible with semiconductor processes, including W, Mo, Ir, Al, Pt, Ru, Nb, and/or Hf, for example. In various configurations, the top electrode 240 may be formed of two or more layers of electrically conductive materials, which may by the same as or different from one another. Also, the configuration and/or the material(s) forming the top electrode 240 may be the same as or different from the configuration and/or the material(s) forming the bottom electrode 210. The above descriptions of the bottom and top electrodes 210 and 240 equally apply to the other bottom and top electrodes identified herein, and therefore will not be repeated.

The piezoelectric layer 230 may be formed of any piezoelectric material compatible with semiconductor processes, such as aluminum nitride (AlN), zinc oxide (ZnO), or zirconate titanate (PZT), for example. Of course, other materials may be incorporated into the above and other features of LCRF device 200B (as well as the other acoustic resonator described herein) without departing from the scope of the present teachings. Also, in various embodiments, piezoelectric layer 230 may be "doped" with at least one rare earth element, such as scandium (Sc), yttrium (Y), lanthanum (La), or erbium (Er), for example, to increase the piezoelectric coupling coefficient $e_{33}$ in the piezoelectric layer 230, thereby off-setting at least a portion of the degradation of the electromechanical coupling coefficient $Kt^2$ of the acoustic resonator caused by the air-gap 251-254 and/or 261-264. Examples of doping piezoelectric layers with one or more rare earth elements for improving electromechanical coupling coefficient $Kt^2$ are provided by U.S. patent application Ser. No. 13/662,425 (filed Oct. 27, 2012), to Bradley et al. (issued as U.S. Pat. No. 9,225,313 on Dec. 29, 2015), and U.S. patent application Ser. No. 13/662,460 (filed Oct. 27, 2012), to Grannen et al. (issued as U.S. Pat. No. 9,136,819 on Sep. 15, 2015), which are hereby incorporated by reference in their entireties. Of course, doping piezoelectric layers with one or more rare earth elements may be applied to any of various embodiments. The above description of the piezoelectric layer 230 equally applies to the other piezoelectric layers identified herein, and therefore will not be repeated.

The planarization layer 220 may be formed of NEBSG, for example. In various embodiments, the planarization layer 220 may be formed of the same material as the support frame 250 and/or 260 to increase efficiency of the fabrication process. This particularly is the case with regard to the support frame 260, including air-gaps 261-264, formed between the bottom electrode 210 and the piezoelectric layer 230, since the support frame 260 and the planarization layer 220 are adjacent and may be formed in consecutive steps. The planarization layer 220 is not strictly required for the functioning of the LCRF devices 200A-200D, but its presence can confer various benefits. For instance, the presence of the planarization layer 220 tends to improve structural stability, may improve the quality of growth of subsequent layers, and may allow bottom electrode 210 to be formed without its edges extending beyond the cavity 208. Further examples of potential benefits of planarization and/or method of fabricating the same are presented in U.S. Patent Application Publication No. 2013/0106534 (published May 2, 2013) to Burak et al., and U.S. patent application Ser. No. 14/225,710 (filed Mar. 26, 2014) to Nikkel et al. (published as U.S. Patent Application Publication No. 2015/0280679 on Oct. 1, 2015), which are hereby incorporated by reference in their entireties.

Figure 3:
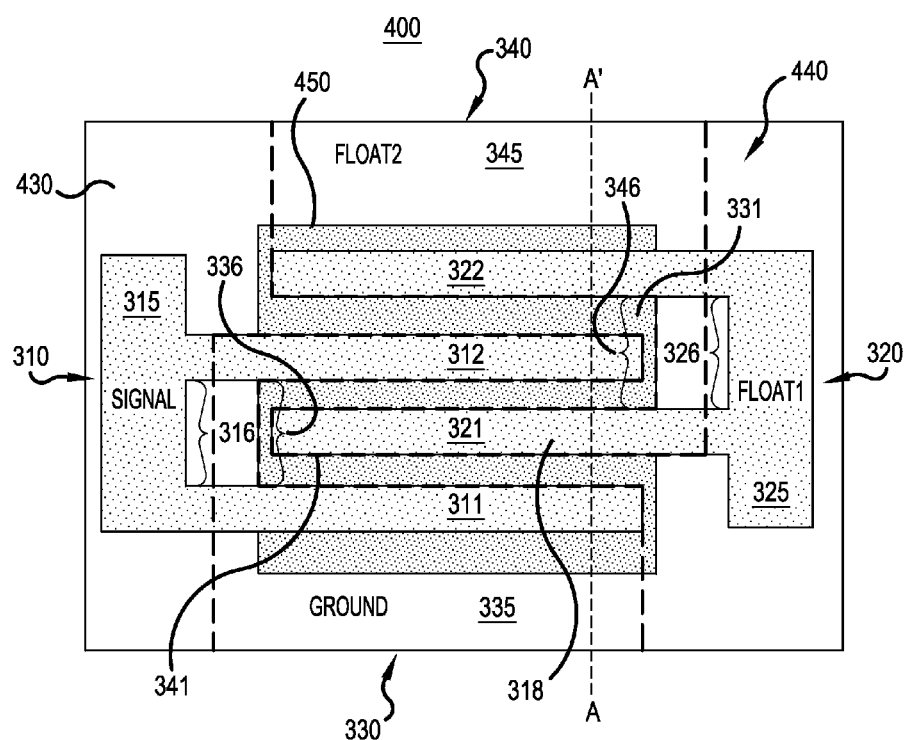
FIG. 3 is a top plan view of a differential LCRF device with at least one support frame, according to a representative embodiment.

FIG. 3 is a top plan view of a LCRF device with at least one support frame, according to a representative embodiment, and FIGS. 4A-4D are cross-sectional views of the LCRF in FIG. 3 taken along a line A-A' according to different embodiments. More particularly, FIG. 3 depicts LCRF device 400, which is a differential LRCF (as opposed a single-ended LCRF, discussed above). The cross-sectional views correspond to different variations of the differential LCRF device 400, respectively, as LCRF devices 400A-400D, which may be referred to as CCRs. The LCRF devices 400A-400D have many of the same features, so a repetitive description of these features may be omitted in an effort to avoid redundancy.

Referring to FIG. 3, LCRF device 400 includes a top electrode 440 (or top contour electrode) comprising a first top comb electrode 310 and second top comb electrode 320. The first top comb electrode 310 includes a first top bus bar 315 and multiple representative first top fingers 311 and 312, separated by first space 316. The first top fingers 311 and 312 extend in a first direction from the first top bus bar 315. The second top comb electrode 320 similarly includes a second top bus bar 325 and multiple representative second top fingers 321 and 322, separated by second space 326. The second top fingers 321 and 322 extend in a second direction, opposite the first direction, from the second top bus bar 325. The first top comb electrode 310 is a signal electrode to which an electrical signal is applied, and the second top comb electrode 320 is a top (first) floating electrode providing an output for the electrical signal.

The top electrode 440 is interdigitated in that the first top finger 312 extends into the second space 326 between the second top fingers 321 and 322, and the second top finger 321 extend into the first space 316 between the first top fingers 311 and 312, creating top interleaving pattern of the LCRF device 400. The alternating first and second top fingers 311, 321, 312 and 322 are likewise separated by spaces or gaps 318, respectively. In the depicted embodiment, a top surface of a support frame 450 (discussed below) is visible through the gaps 318. However, in alternative embodiments, the support frame 450 is not present (e.g., as shown in FIG. 4B), in which case a top surface of a piezoelectric layer 430 (discussed below) would be visible through the gaps 318.

The LCRF device 400 further includes a bottom electrode 410 (or bottom contour electrode) comprising a first bottom comb electrode 330 and second bottom comb electrode 340. The first bottom comb electrode 330 includes a first bottom bus bar 335 and at least one first bottom comb extension or first bottom comb-like finger, indicated by representative first bottom finger 331, which is separated from the first bottom bus bar 335 by first space 336. The first bottom finger 331 extends in a first direction away from the first top bus bar 315. The second bottom comb electrode 340 similarly includes a second bottom bus bar 345 and at least one second bottom comb extension or comb-like finger, indicated by representative second bottom finger 341, which is separated from the second bottom bus bar 345 by second space 346. The second bottom finger 341 extends in a second direction, opposite the first direction, away from the second top bus bar 325. The first bottom electrode 330 is a ground electrode connected to ground, and the second bottom electrode 340 is a bottom (second) floating electrode providing another output for the electrical signal. The bottom electrode 410 is likewise interdigitated in that the first bottom finger 331 extends into the second space 346, and the second bottom finger 341 extends into the first space 336, creating a bottom interleaving pattern of the LCRF device 400.

FIGS. 4A to 4D are cross-sectional diagrams, taken along line A-A' of FIG. 3, illustrating LCRF devices, according to representative embodiments. Each of the LCRF devices shown in FIGS. 4A to 4D includes a bottom contour electrode having a bottom interleaving pattern, thus depicting a differential LCRF filter configuration.

Figure 4A:
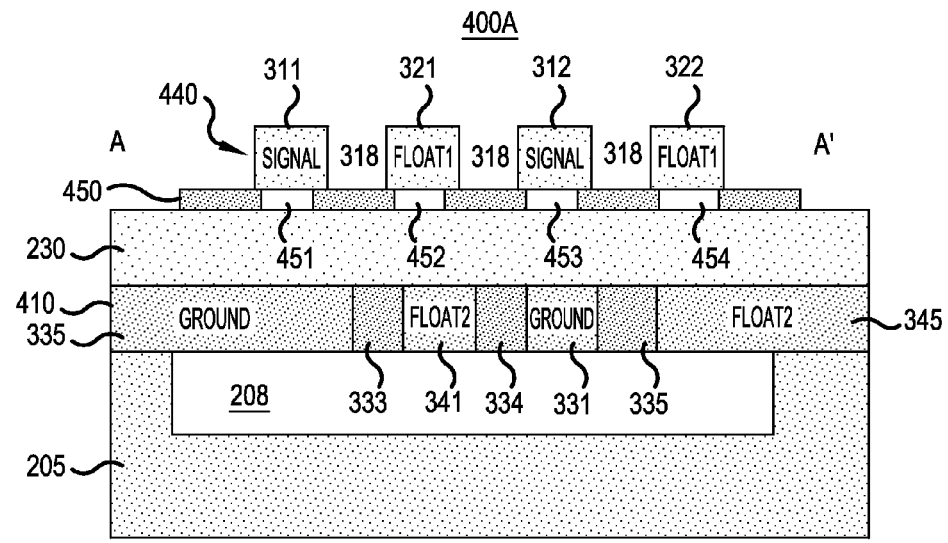
FIGS. 4A-4D are cross-sectional diagrams, taken along line A-A' of FIG. 1, illustrating the differential LCRF device, according to various representative embodiments.
Figure 4B:
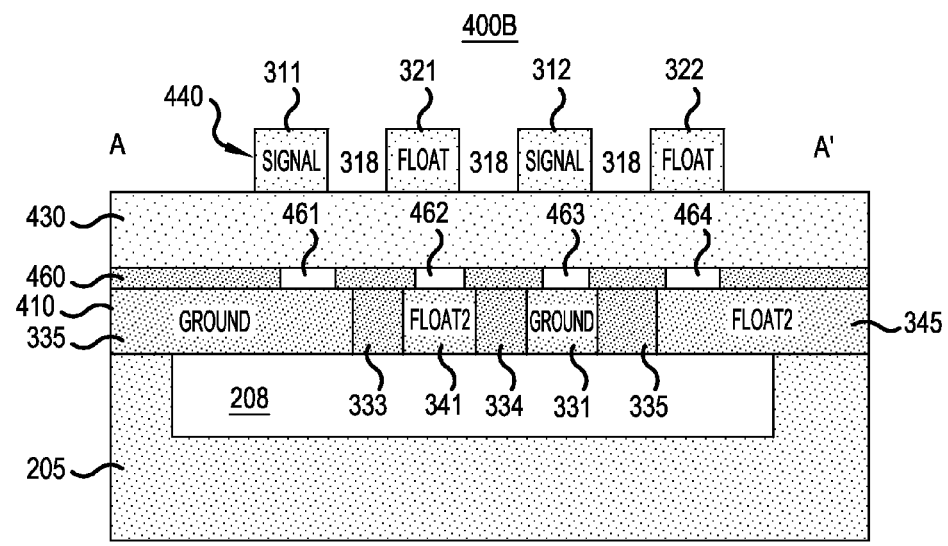

Referring to FIG. 4A, LCRF device 400A includes substrate 205 defining a cavity 208 (e.g., air cavity), which serves as an acoustic reflector. The LCRF device 400A further includes the bottom (contour) electrode 410 disposed on the substrate 205 over the cavity 208, a piezoelectric layer 430 disposed on the bottom electrode 410, and a top electrode 440 disposed over the piezoelectric layer 430. (Although not shown, a planarization layer may be included adjacent the bottom electrode 410, as needed, in this and the other embodiments.) In addition, the LCRF device 400A includes a support frame 450 positioned between the piezoelectric layer 430 and the top electrode 440. The support frame 450 defines air-gaps, indicated by representative air-gaps 451, 452, 453 and 454, separating the top electrode 440 from and the piezoelectric layer 430. More particularly, the support frame 450 is configured such that the air-gaps 451-454 are arranged beneath the first top finger 311, the second top finger 321, the first top finger 312 and the second top finger 322, respectively, creating an opening of air between a top surface of the piezoelectric layer 430 and a bottom surface of each of the first top fingers 311, 312 and the second top fingers 321, 322. The support frame 450 is substantially the same as the support frame 250, and is formed in substantially the same manner, as discussed above.

More particularly, the support frame 450 is configured such that the air-gaps 451-454 are arranged beneath the first top finger 311, second top finger 321, the first top finger 312 and the second top finger 322, respectively, creating an opening of air between a top surface of the piezoelectric layer 430 and a bottom surface of each of the first top fingers 311, 312 and the second top fingers 321, 322. The air-gaps 451-454, together with the cavity 208, enable movement (or vibration) of the piezoelectric layer 430 in a vertical (as opposed to lateral) direction.

As stated above, the first top comb electrode 310 is a top signal electrode to which an electrical signal is applied, and the second top comb electrode 320 is a top floating electrode providing an output for the electrical signal. In addition, the first bottom comb electrode 330 is a ground electrode, and the second bottom comb electrode 340 is a bottom floating electrode providing another output for the electrical signal. Therefore, as shown in FIG. 4A, the first top fingers 311 and 312 receive the input electrical signal, the second top fingers 321 and 322 and the second bottom finger 341 are floating, and the first bottom finger 331 is grounded. Notably, in the depicted embodiment, the spaces between the first and second bottom bus bars 335 and 345 and the first and second bottom fingers 331 and 341 of the bottom electrode 410 are filled with a dielectric material (as opposed to being air spaces), such as NEBSG or non-conductive SiC, for example. These filled spaces include space 333 between the first bottom bus bar 335 and the second bottom finger 341, space 334 between the second bottom finger 341 and the first bottom finger 331, and space 335 between the first bottom finger 331 and the second bottom bus bar 345. The spaces 333-335 are at least partially aligned with the gaps 318 between the first top fingers 311, 312 and the second top fingers 321, 322, respectively. Also, the first bottom finger 331 is at least partially aligned with the first top finger 312, and the second bottom finger 341 is at least partially aligned with the second top finger 321. However, the relative placements of the bottom spaces 333-335 and the top gaps 318, as well as the relative placements the first and second bottom fingers 331, 341 and the first and second top fingers 311, 312, 321, 322, may vary without departing from the scope of the present teachings.

Referring to FIG. 4B, LCRF device 400B includes the substrate 205 defining the cavity 208, the bottom electrode 410 disposed on the substrate 205 over the cavity 208, the piezoelectric layer 430 disposed over the bottom electrode 410, and the top electrode 440 disposed on the piezoelectric layer 430. The LCRF device 400B further includes a support frame 460 positioned between the piezoelectric layer 430 and the bottom electrode 410. The support frame 460 defines air-gaps, indicated by representative air-gaps 461, 462, 463 and 464, separating the bottom electrode 410 from and the piezoelectric layer 430. More particularly, the support frame 460 is configured such that the air-gaps 461-464 are arranged beneath the first top finger 311, the second top finger 321, the first top finger 312 and the second top finger 322, respectively, although with the piezoelectric layer 430 in between. Each of the air-gaps 461-464 creates an opening of air between a bottom surface of the piezoelectric layer 430 and a top surface of the bottom electrode 410. As discussed above, the air-gaps 461-464, together with the cavity 208, enable movement (or vibration) of the piezoelectric layer 430 in a vertical direction. Also, the presence of the air-gaps 461-464 may make the cavity 208 optional.

Figure 4C:
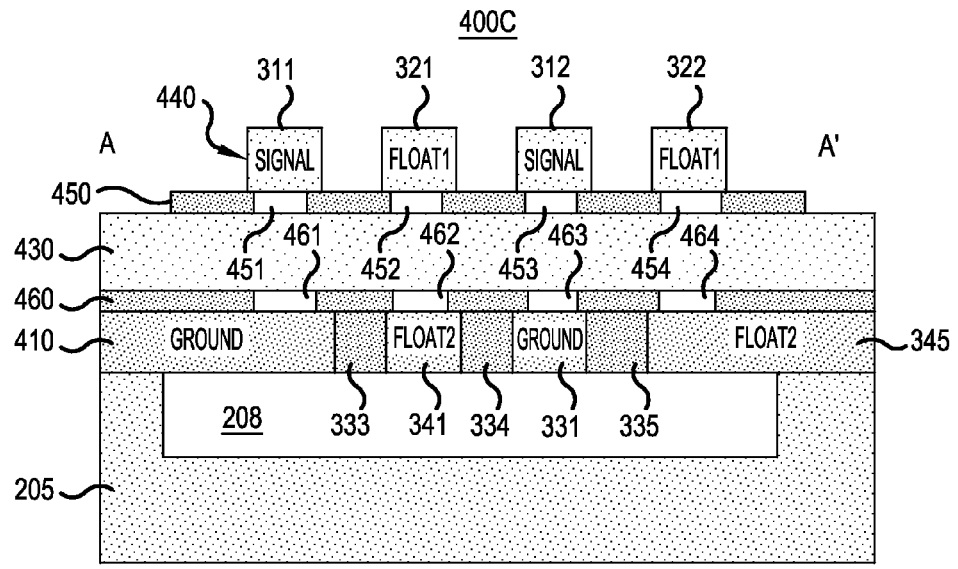

Referring to FIG. 4C, LCRF device 400C substantially combines the configurations of the differential LCRF devices 400A and 400B. That is, the LCRF device 400C includes both the support frame 450 positioned between the piezoelectric layer 430 and the top electrode 440, and the support frame 460 positioned between the piezoelectric layer 430 and the bottom electrode 410. Again, the presence of the air-gaps 461-464 directly below the piezoelectric layer 430 and above the bottom electrode 410 may make the cavity 208 optional, regardless of the presence of the air-gaps 451-454.

Figure 4D:
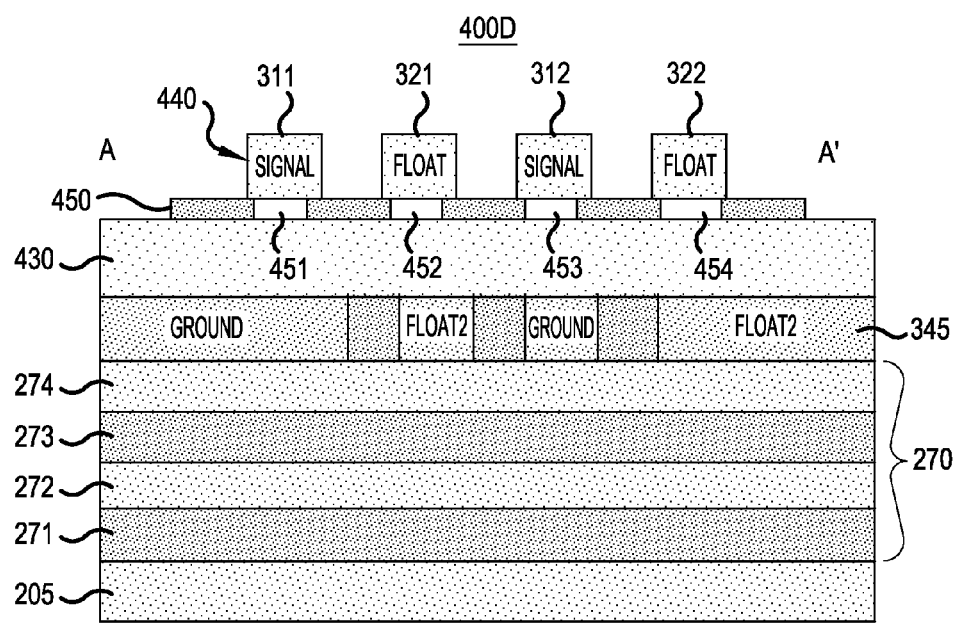

Referring to FIG. 4D, LCRF device 400D is substantially the same as LCRF device 400A, except that the acoustic reflector is implemented as an acoustic mirror, such as the representative DBR 270, as opposed to the cavity 208. In this configuration, the DBR 270 is disposed on the substrate 205, the bottom electrode 410 is disposed on the DBR 270, the piezoelectric layer 430 is disposed on the bottom electrode 410, and the top electrode 440 is disposed over the piezoelectric layer 430. In addition, the LCRF device 400D includes the support frame 450 positioned between the piezoelectric layer 430 and the top electrode 440. Of course, the DBR 270 may likewise be substituted for the cavity 208 in the LCRF device 400B and the LCRF device 400C, without departing from the scope of the present teachings.

Figure 5:
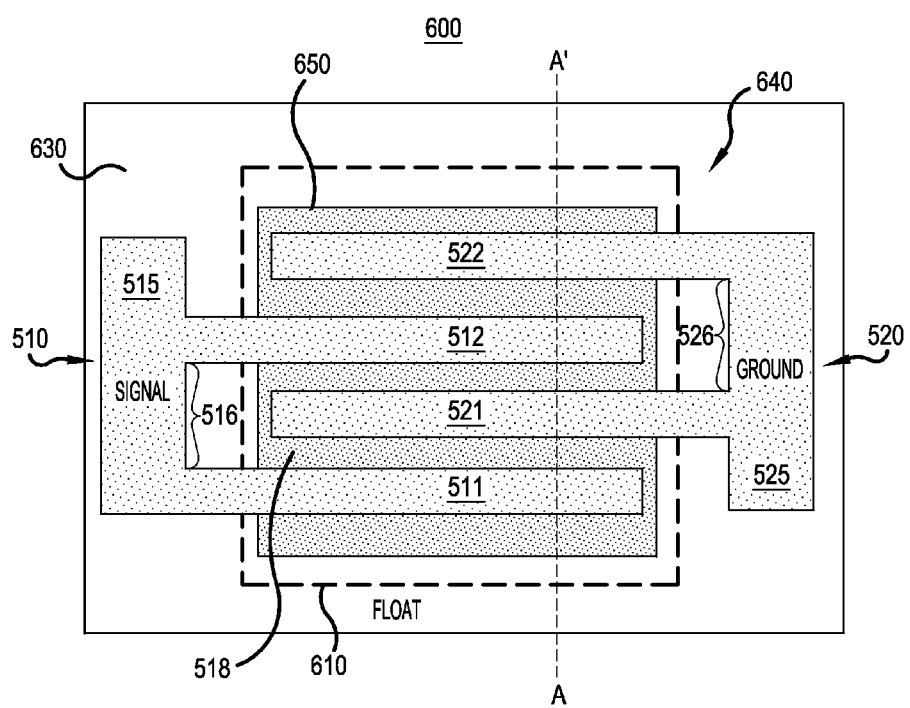
FIG. 5 is a top plan view of a lateral-field-excitation (LFE) contour mode resonator (CMR) device with at least one support frame, according to a representative embodiment.

FIG. 5 is a top plan view of a lateral-field-excitation (LFE) contour mode resonator (CMR) device with at least one support frame, according to a representative embodiment, and FIGS. 6A-6D are cross-sectional views of the LFE-CMR device in FIG. 5 taken along a line A-A' according to different embodiments. More particularly, the cross-sectional views correspond to different variations of the LFE-CMR device 600, respectively, as LFE-CMR devices 600A-600D, which may be referred to as capacitive coupled electrodes (CCEs). The LFE-CMR devices 600A-600D have many of the same features, so a repetitive description of these features may be omitted in an effort to avoid redundancy.

Referring to FIG. 5, LFE-CMR device 600 includes a top electrode 640, which may be referred to as a contour electrode, comprising a first top comb electrode 510 and second top comb electrode 520. The first top comb electrode 510 includes a first top bus bar 515 and multiple first top comb extensions or first top comb-like fingers, indicated by representative first top fingers 511 and 512, separated by first space 516. The first top fingers 511 and 512 extend in a first direction from the first top bus bar 515. The second top comb electrode 520 similarly includes a second top bus bar 525 and multiple second top comb extensions or top comb-like fingers, indicated by representative second top fingers 521 and 522, separated by second space 526. The second top fingers 521 and 522 extend in a second direction, opposite the first direction, from the second top bus bar 525. The first top comb electrode 510 is a signal electrode to which an electrical signal is applied, and the second top comb electrode 520 is a ground electrode (as opposed to a floating electrode, as discussed above with reference to second top comb electrodes in FIGS. 1-4D) connected to ground.

The top electrode 640 is interdigitated in that the first top fingers 511 and 512 of the first top comb electrode 510 extend into the second space 526 between the second top fingers 521 and 522 of the second top comb electrode 520, and the second top fingers 521 and 522 of the second top comb electrode 520 extend into the first space 516 between the first top fingers 511 and 512 of the first top comb electrode 510. This arrangement forms a top interleaving pattern. The alternating first and second top fingers 511, 521, 512, and 522 are likewise separated by spaces or gaps 518, respectively. In the depicted embodiment, a top surface of a support frame 650 (discussed below) is visible through the gaps 518. However, in alternative embodiments, the support frame 650 is not present (e.g., as shown in FIG. 6B), in which case a top surface of a piezoelectric layer 630 (discussed below) would be visible through the gaps 518.

FIGS. 6A to 6D are cross-sectional diagrams, taken along line A-A' of FIG. 5, illustrating LFE-CMR devices, according to representative embodiments. Each of the LFE-CMR devices shown in FIGS. 6A to 6D includes a single bottom electrode, thus depicting the LFE configuration.

Figure 6A:
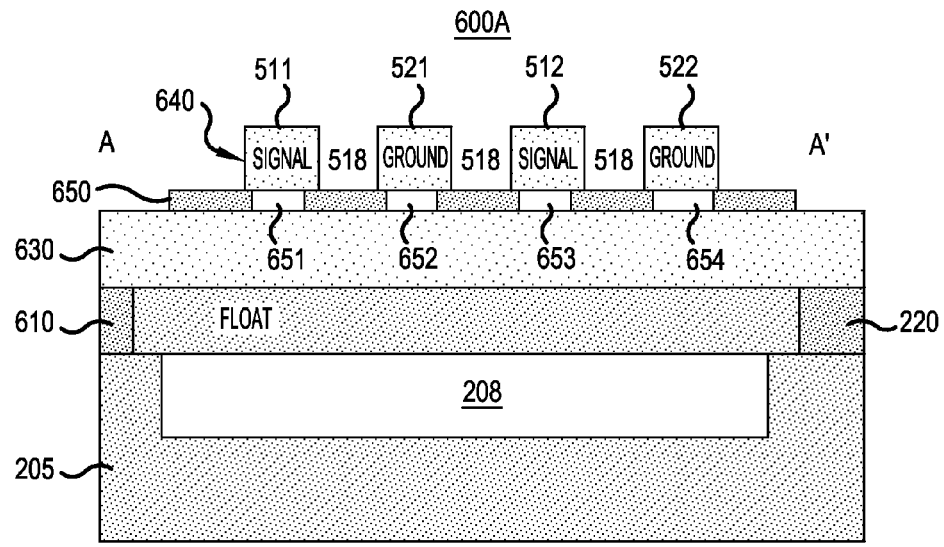
FIGS. 6A-6D are cross-sectional views of the LFE-CMR device in FIG. 5 taken along a line A-A', according to various representative embodiments.
Figure 6B:
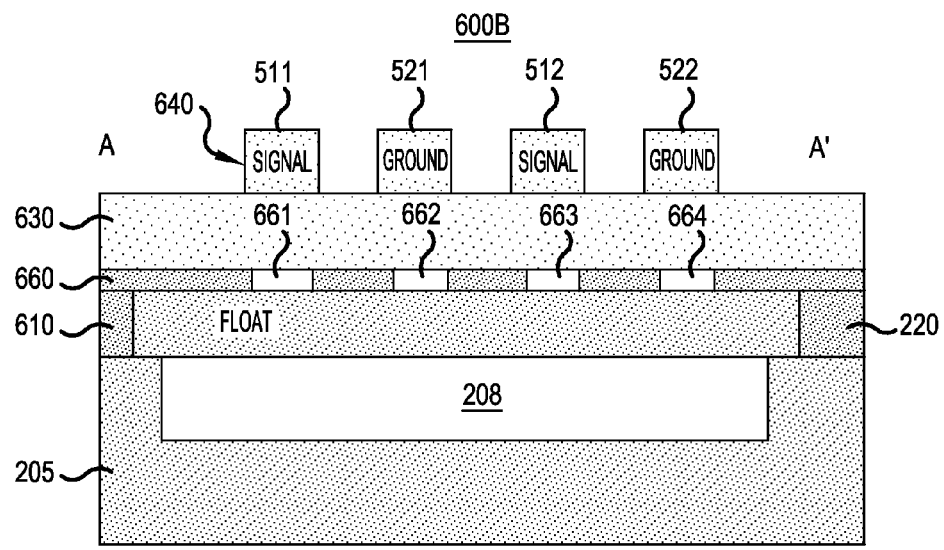

Referring to FIG. 6A, LFE-CMR device 600A includes the substrate 205 defining the cavity 208, a bottom electrode 610 disposed on the substrate 205 over the cavity 208, a planarization layer 220 (optional) disposed adjacent to bottom electrode 610 on the substrate 205, a piezoelectric layer 630 disposed on the bottom electrode 610 and the planarization layer 220, and a top (contour) electrode 640 disposed over the piezoelectric layer 630. In addition, the LFE-CMR device 600A includes a support frame 650 positioned between the piezoelectric layer 630 and the top electrode 640. The support frame 650 defines air-gaps, indicated by representative air-gaps 651, 652, 653 and 654, separating the top electrode 640 from and the piezoelectric layer 630. Generally, the support frame 650 is substantially the same as the support frame 250 discussed above with reference to FIG. 2A.

As stated above, the first top comb electrode 510 is a signal electrode to which an electrical signal is applied, and the second top comb electrode 520 is a ground electrode. Therefore, as shown in FIG. 6A, the first top fingers 511 and 512 receive the input electrical signal, and the second top fingers 521 and 522 are grounded. Meanwhile, the bottom electrode 610 is floating. (Because it is floating, the bottom electrode 610 may be described simply as a conductive or metal layer, but for the sake of simplifying description, the floating bottom electrode 610 will continue to be referred to as an electrode when configured in a floating condition.) As a result, application of the electrical signal to the first top fingers 511 and 512 excites mechanical motion (i.e., predominantly lateral-field-excitation) in the piezoelectric layer 630 resulting both from lateral electric field between the first top fingers 511 and 512 and the grounded second top fingers 521 and 522, as well as from vertical electric field between the first top fingers 511 and 512, the floating electrode 610, and the grounded second top fingers 521 and 522.

Referring to FIG. 6B, the LFE-CMR device 600B includes the substrate 205 defining the cavity 208, the bottom electrode 610 disposed on the substrate 205 over the cavity 208, the planarization layer 220 (optional) disposed adjacent to bottom electrode 610 on the substrate 205, the piezoelectric layer 630 disposed over the bottom electrode 610 and the planarization layer 220, and the top electrode 640 disposed on the piezoelectric layer 630. The LFE-CMR device 600B further includes a support frame 660 positioned between the piezoelectric layer 630 and the bottom electrode 610 (as well as the planarization layer 220). The support frame 660 defines air-gaps, indicated by representative air-gaps 661, 662, 663 and 664, separating the bottom electrode 610 from and the piezoelectric layer 630. Generally, the support frame 660 is substantially the same as the support frame 260 discussed above with reference to FIG. 2B. As in the LFE-CMR device 600A, application of the electrical signal to the first top fingers 511 and 512 of the LFE-CMR device 600B excites mechanical motion (i.e., predominantly lateral-field-excitation) in the piezoelectric layer 630 resulting both from lateral electric field between the first top fingers 511 and 512 and the grounded second top fingers 521 and 522, as well as from vertical electric field between the first top fingers 511 and 512, the floating electrode 610, and the grounded second top fingers 521 and 522. Again, the presence of the air-gaps 661-664 directly below the piezoelectric layer 630 and above the bottom electrode 610 makes the cavity 208 optional.

Figure 6C:
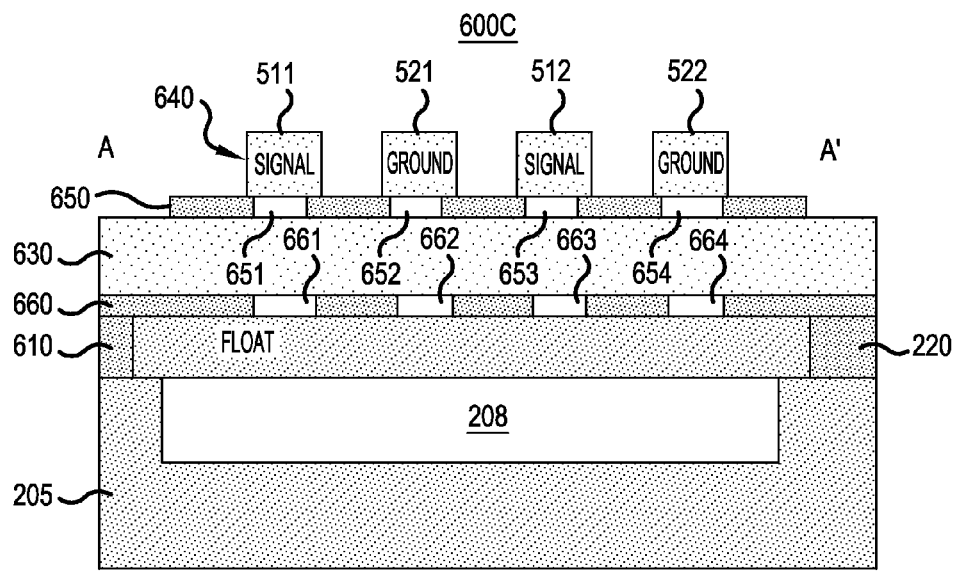
Figure 6D:
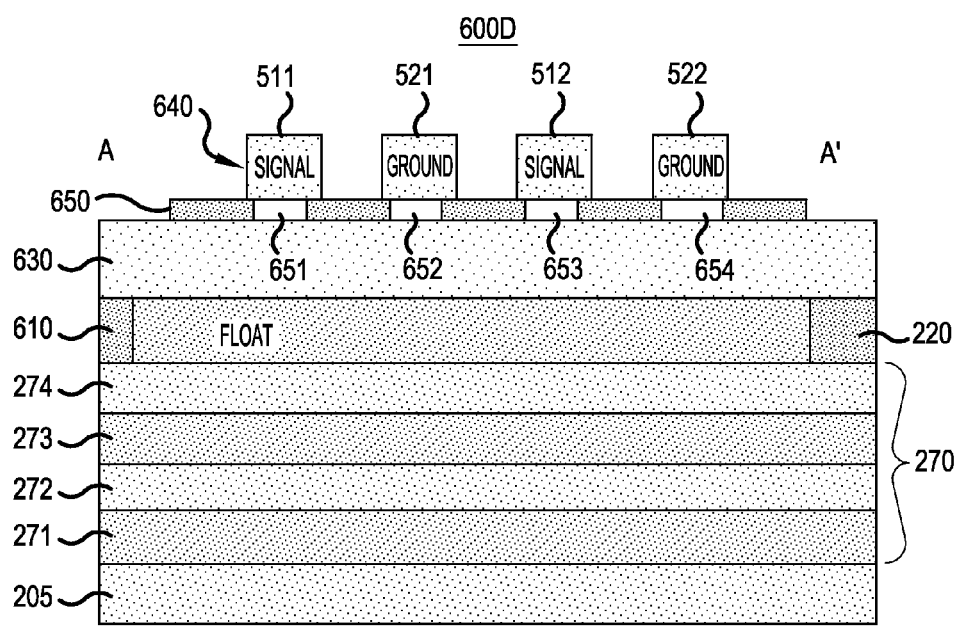

Referring to FIG. 6C, LFE-CMR device 600C substantially combines the configurations of the LFE-CMR devices 600A and 600B. That is, the LFE-CMR device 600C includes both the support frame 650 positioned between the piezoelectric layer 630 and the top electrode 640, and the support frame 660 positioned between the piezoelectric layer 630 and the bottom electrode 610 (and the planarization layer 220). Referring to FIG. 6D, LFE-CMR device 600D is substantially the same as LFE-CMR device 600A, except that the acoustic reflector is implemented as an acoustic mirror, such as the DBR 270, as opposed to the cavity 208. The LFE-CMR device 600D may also be referred to as a solidly mounted LFE-CMR. Of course, the DBR 270 may likewise be substituted for the cavity 208 in the LFE-CMR device 600B and the LFE-CMR device 600C, without departing from the scope of the present teachings.

Figure 7A:
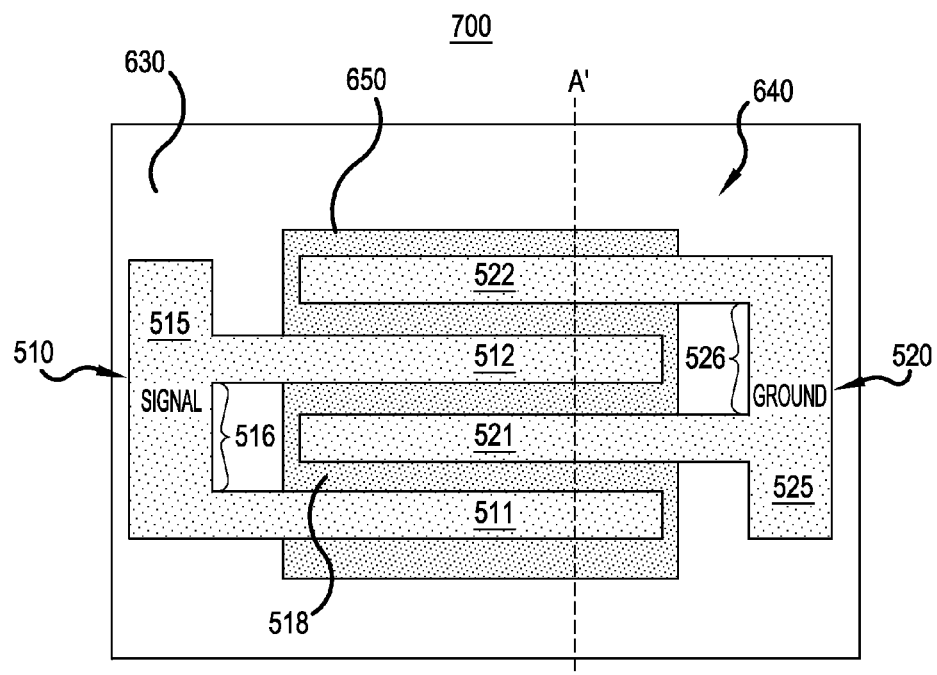
FIG. 7A is a top plan view of a LFE-CMR device with a support frame and no bottom metal layer, according to a representative embodiment.
Figure 7B:
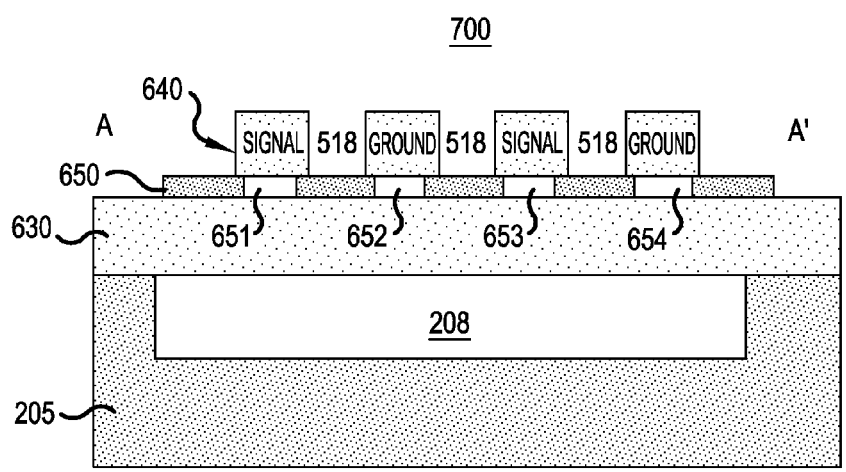
FIG. 7B is a cross-sectional view of the LFE-CMR device in FIG. 7A taken along a line A-A', according to the representative embodiment.

FIG. 7A is a top plan view of a lateral-field-excitation (LFE) contour mode resonator (CMR) device with a support frame and no bottom metal, according to a representative embodiment. FIG. 7B is a cross-sectional view of the LFE-CMR device in FIG. 7A taken along a line A-A', according to the representative embodiment.

Referring to FIGS. 7A and 7B, LFE-CMR device 700 includes a top electrode 640, which may be referred to as a contour electrode, comprising a first top comb electrode 510 and second top comb electrode 520. The first top comb electrode 510 includes a first top bus bar 515 and multiple representative first top fingers 511 and 512 separated by first space 516. The first top fingers 511 and 512 extend in a first direction from the first top bus bar 515. The second top comb electrode 520 similarly includes a second top bus bar 525 and multiple representative second top fingers 521 and 522 separated by second space 526. The second top fingers 521 and 522 extend in a second direction, opposite the first direction, from the second top bus bar 525. The first top comb electrode 510 is a signal electrode to which an electrical signal is applied, and the second top comb electrode 520 is a ground electrode. The top electrode 640 is interdigitated in that the first top fingers 511 and 512 of the first top comb electrode 510 extend into the second space 526 between the second top fingers 521 and 522 of the second top comb electrode 520, and the second top fingers 521 and 522 of the second top comb electrode 520 extend into the first space 516 between the first top fingers 511 and 512 of the first top comb electrode 510. This arrangement forms a top interleaving pattern.

The LFE-CMR device 700 includes the substrate 205 defining the cavity 208, the piezoelectric layer 630 disposed on the substrate 205 over the cavity 208, and support frame 650 disposed on the piezoelectric layer 630, and the top (contour) electrode 640 disposed on the support frame 650. In an alternative embodiment, the cavity 208 may be replaced by an acoustic mirror, such as the DBR 270, to provide an acoustic resonator, without departing from the scope of the present teachings. As mentioned above, the LFE-CMR device 700 includes no bottom metal, so there is not bottom electrode 610, for example. As discussed above, the support frame 650 defines air-gaps, indicated by representative air-gaps 651, 652, 653 and 654, separating the top electrode 640 from and the piezoelectric layer 630. As a result of this configuration (e.g., no floating bottom electrode 610 or other metal layer between the piezoelectric layer 630 and the substrate 205, application of the electrical signal to the first top fingers 511 and 512 excites the piezoelectric layer 630 through lateral coupling, thus effectively resembling a surface acoustic wave (SAW) resonator. Notably, the presence of the cavity 208 prevents a pure surface wave from existing in the LFE-CMR device 700. Instead, two Lamb modes exist, one with peak energy confined to the top surface of the piezoelectric layer 630 and the other one with the peak energy confined to the bottom surface of the piezoelectric layer 630. In LFE-CMR device 700 the lateral electric field predominantly excites the Lamb mode with peak energy confined to the top surface of piezoelectric layer 630 at frequencies close to the series resonance frequency Fs. However, some residual excitation of the Lamb mode with peak energy confined to the bottom surface of piezoelectric layer 630 through the fringing electric field also may be possible.

Figure 8:
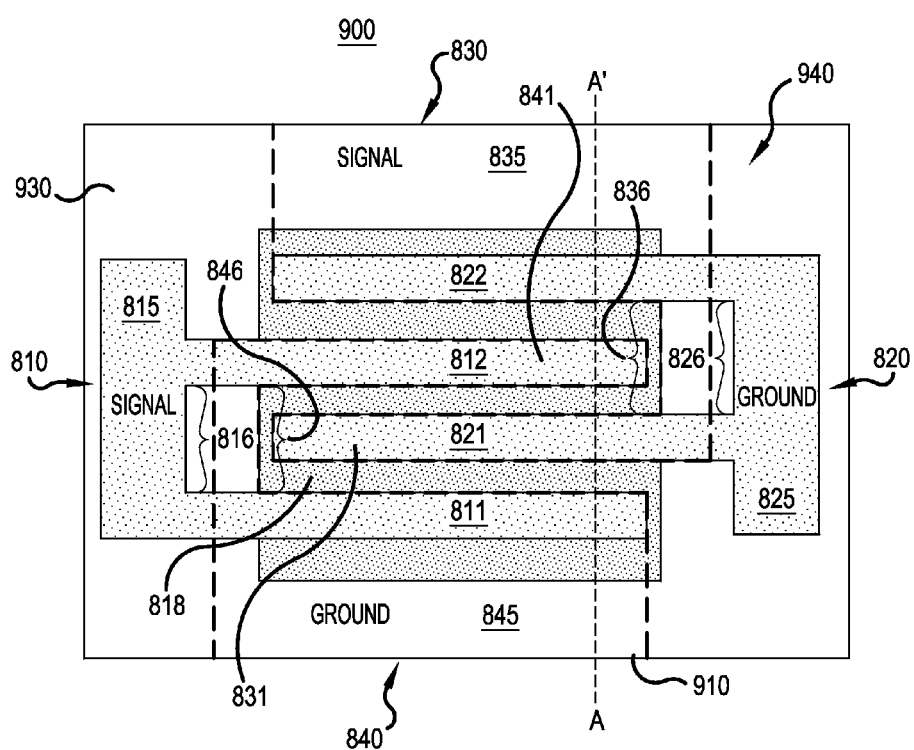
FIG. 8 is a top plan view of a thickness-field-excitation (TFE) contour mode resonator (CMR) device with at least one support frame, according to a representative embodiment.

FIG. 8 is a top plan view of a thickness-field-excitation (TFE) contour mode resonator (CMR) device with at least one support frame, according to a representative embodiment, and FIGS. 9A-9D are cross-sectional views of the TFE-CMR device in FIG. 8 taken along a line A-A' according to different embodiments. More particularly, the cross-sectional views correspond to different variations of the TFE-CMR device 900, respectively, as TFE-CMR devices 900A-900D, which may be referred to as capacitive coupled electrodes (CCEs). The TFE-CMR devices 900A-900D have many of the same features, so a repetitive description of these features may be omitted in an effort to avoid redundancy.

Referring to FIG. 8, TFE-CMR device 900 includes a top electrode 940 (or top contour electrode) comprising a first top comb electrode 810 and second top comb electrode 820. The first top comb electrode 810 includes a first top bus bar 815 and multiple representative first top fingers 811 and 812, separated by first space 816. The first top fingers 811 and 812 extend in a first direction from the first top bus bar 815. The second top comb electrode 820 similarly includes a second top bus bar 825 and multiple representative second top fingers 821 and 822, separated by second space 826. The second top fingers 821 and 822 extend in a second direction, opposite the first direction, from the second top bus bar 825. The first top comb electrode 810 is a top signal electrode to which an electrical signal is applied, and the second top comb electrode 820 is a top ground electrode connected to ground. The top electrode 840 is interdigitated in that the first top finger 812 extends into the second space 826 between the second top fingers 821 and 822, and the second top finger 821 extend into the first space 816 between the first top fingers 811 and 812, creating top interleaving pattern. The alternating first and second top fingers 811, 821, 812 and 822 are likewise separated by spaces or gaps 818, respectively.

The TFE-CMR device 900 further includes a bottom electrode 910 (or bottom contour electrode) comprising a first bottom comb electrode 830 and second bottom comb electrode 840. The first bottom comb electrode 830 includes a first bottom bus bar 835 and at least one representative first bottom finger 831, which is separated from the first bottom bus bar 835 by first space 836. The first bottom finger 831 extends in the second direction away from the second top bus bar 825. The second bottom comb electrode 840 similarly includes a second bottom bus bar 845 and at least one representative second bottom finger 841, which is separated from the second bottom bus bar 845 by second space 846. The second bottom finger 841 extends in the first direction, opposite the second direction, away from the first top bus bar 815. The first bottom comb electrode 830 is a bottom signal electrode, and the second bottom comb electrode 840 is a bottom ground electrode connected to ground. The bottom electrode 910 is likewise interdigitated in that the first bottom finger 831 extends into the second space 846, and the second bottom finger 841 extends into the first space 836, creating a bottom interleaving pattern.

FIGS. 9A to 9D are cross-sectional diagrams, taken along line A-A' of FIG. 8, illustrating TFE-CMR devices, according to representative embodiments. Each of the TFE-CMR devices shown in FIGS. 9A to 9D includes a bottom contour electrode having a bottom interleaving pattern, thereby enabling thickness-field-excitation.

Figure 9A:
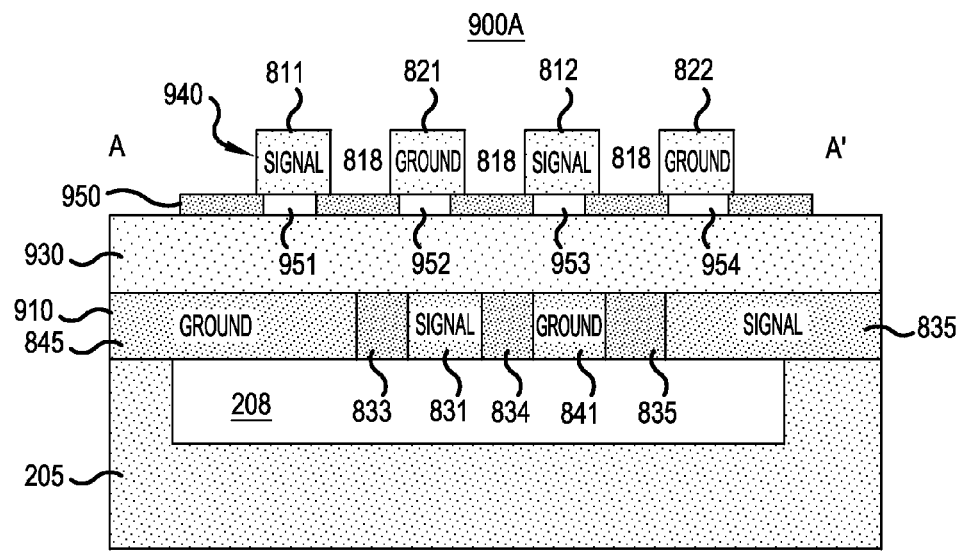
FIGS. 9A-9D are cross-sectional views of the TFE-CMR device in FIG. 8 taken along a line A-A', according to various representative embodiments.

Referring to FIG. 9A, TFE-CMR device 900A includes substrate 205 defining a cavity 208, the bottom (contour)

electrode 910 disposed on the substrate 205 over the cavity 208, a piezoelectric layer 930 disposed on the bottom electrode 910, a support frame 950 disposed on the piezoelectric layer 930 and the top electrode 940 disposed on the support frame 950. (Although not shown, a planarization layer may be included adjacent the bottom electrode 910, as needed, in this and the other embodiments.) The support frame 950 defines air-gaps, indicated by representative air-gaps 951, 952, 953 and 954, separating the top electrode 940 from and the piezoelectric layer 930. More particularly, the support frame 950 is configured such that the air-gaps 951-954 are arranged beneath the first top finger 811, the second top finger 821, the first top finger 812 and the second top finger 822, respectively, creating an opening of air between a top surface of the piezoelectric layer 930 and a bottom surface of each of the first top fingers 811, 812 and the second top fingers 821, 822. The support frame 950 is substantially the same as the support frame 250, and is formed in substantially the same manner, as discussed above.

As stated above, the first top comb electrode 810 is a top signal electrode to which an electrical signal is applied, and the second top comb electrode 820 is a top ground electrode. In addition, the first bottom comb electrode 830 is another signal electrode, and the second bottom comb electrode 840 is another ground electrode. Notably, in the depicted embodiment, the spaces between the first and second bottom bus bars 835 and 845 and the second and first bottom fingers 841 and 831 of the bottom electrode 910 are respectively filled with a dielectric material (as opposed to being air spaces), such as NEBSG or non-conductive SiC, for example. These filled spaces include space 833 between the second bottom bus bar 845 and the first bottom finger 831, space 834 between the first and second bottom fingers 831 and 841, and space 835 between the second bottom finger 841 and the first bottom bus bar 835. The spaces 833-835 are at least partially aligned with the gaps 818 between the first top fingers 811, 812 and the second top fingers 821, 822, respectively. Also, the first bottom finger 831 is at least partially aligned with the second top finger 821, and the second bottom finger 841 is at least partially aligned with the first top finger 811. However, the relative placements of the bottom spaces 833-835 and the top gaps 818, as well as the relative placements the first and second bottom fingers 831, 841 and the first and second top fingers 811, 812, 821, 822, may vary without departing from the scope of the present teachings.

Figure 9B:
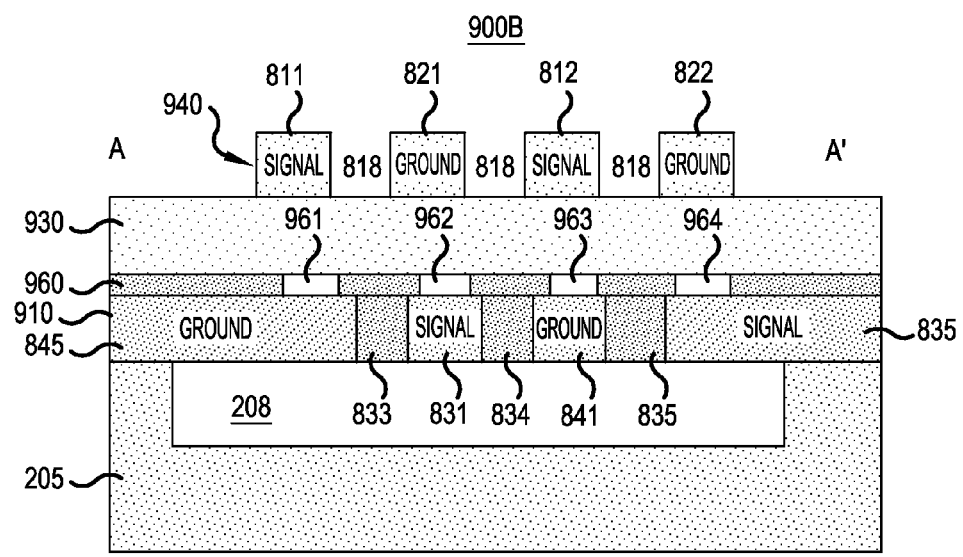

Referring to FIG. 9B, TFE-CMR device 900B includes the substrate 205 defining the cavity 208, the bottom electrode 910 disposed on the substrate 205 over the cavity 208, the support frame 960 disposed on the bottom electrode 910, the piezoelectric layer 930 disposed on the support frame 960, and the top electrode 940 disposed on the piezoelectric layer 930. The support frame 960 defines air-gaps, indicated by representative air-gaps 961, 962, 963 and 964, separating the bottom electrode 910 from and the piezoelectric layer 930. More particularly, the support frame 960 is configured such that the air-gaps 961-964 are arranged beneath the first top finger 811, the second top finger 821, the first top finger 812 and the second top finger 822, respectively, although with the piezoelectric layer 930 in between. Again, the presence of the air-gaps 961-964 directly below the piezoelectric layer 930 and above the bottom electrode 910 may make the cavity 208 optional. Otherwise, the support frame 960 is configured substantially the same as the support frame 950 shown in FIG. 9A.

Figure 9C:
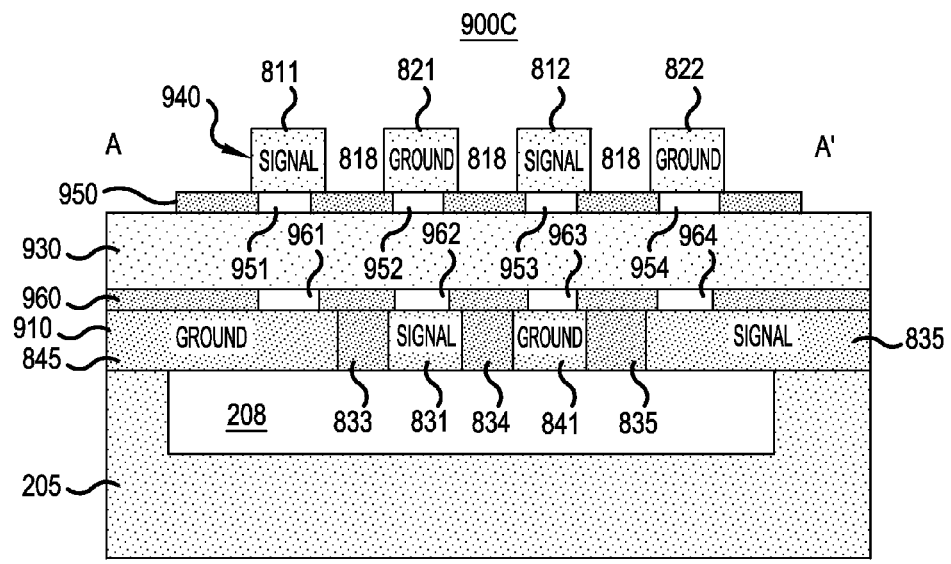
Figure 9D:
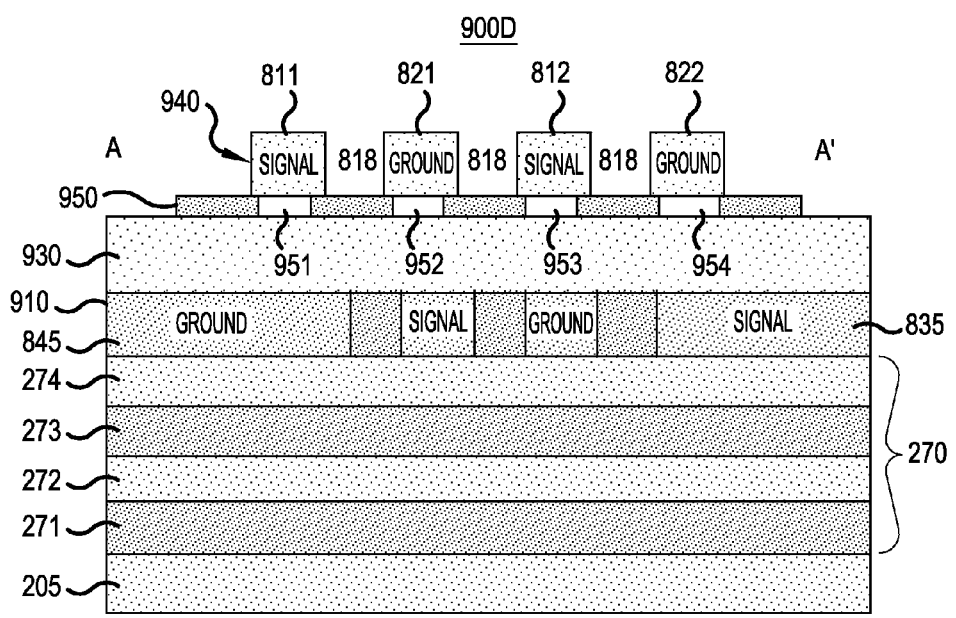

Referring to FIG. 9C, TFE-CMR device 900C substantially combines the configurations of the TFE-CMR devices 900A and 900B. That is, the TFE-CMR device 900C includes both the support frame 950 positioned between the piezoelectric layer 930 and the top electrode 940, and the support frame 960 positioned between the piezoelectric layer 930 and the bottom electrode 910. Referring to FIG. 9D, TFE-CMR device 900D is substantially the same as TFE-CMR device 900A, except that the acoustic reflector is implemented as an acoustic mirror, such as the representative DBR 270, as opposed to the cavity 208. The TFE-CMR device 900D may also be referred to as a solidly mounted TFE-CMR. Of course, the DBR 270 may likewise be substituted for the cavity 208 in the TFE-CMR devices 900B and 900C, without departing from the scope of the present teachings.

In various alternative embodiments, the air-gaps between the piezoelectric layer and one or both of the top and bottom electrodes may be formed by alternative structures, other than a support frame defining air-gaps generally aligned or partially aligned with electrode fingers of top comb electrodes. For example, in various embodiments, at least one set of support pillars is positioned between the piezoelectric layer and the top electrode and/or positioned between the piezoelectric layer and the bottom electrode, where the at least one set of support pillars separates at least one of the top electrode and the bottom electrode from the piezoelectric layer, respectively, thereby defining corresponding air-gaps.

Figure 10:
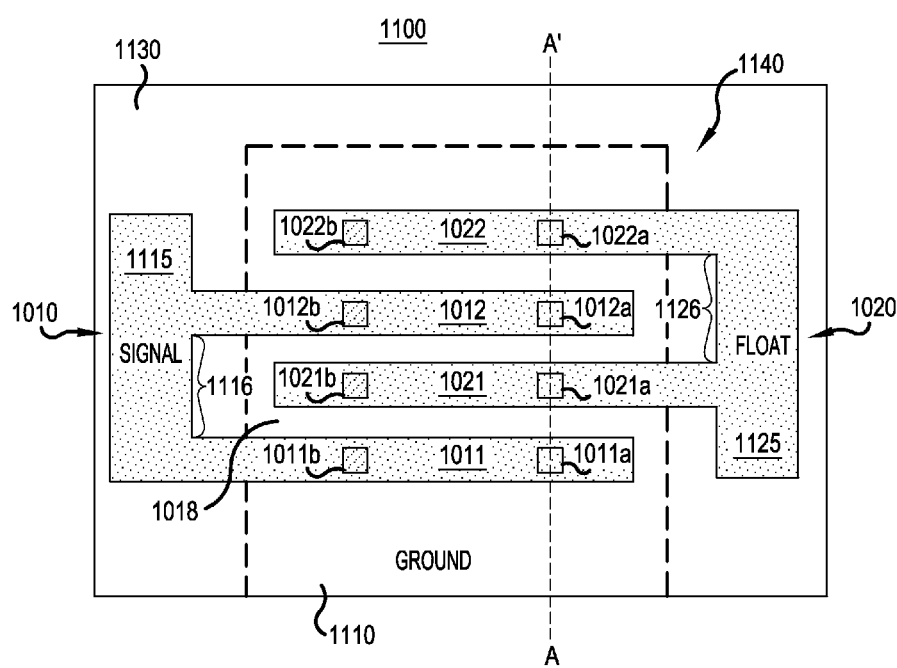
FIG. 10 is a top plan view of a LCRF device with at least one set of support pillars, according to a representative embodiment.

FIG. 10 is a top plan view of a LCRF device with at least one set of support pillars, according to a representative embodiment, and FIGS. 11A-11D are cross-sectional views of the LCRF in FIG. 10 taken along a line A-A' according to different embodiments. More particularly, FIG. 10 depicts LCRF device 1100, which is a single-ended LRCF (as opposed a differential LCRF, discussed below). The cross-sectional views correspond to different variations of the single-ended LCRF device 1100, respectively, as LCRF devices 1100A-1100D, which may be referred to as capacitive coupled electrodes (CCEs). The LCRF devices 1100A-1100D have many of the same features, so a repetitive description of these features may be omitted in an effort to avoid redundancy.

Referring to FIG. 10, LCRF device 1100 includes a top electrode 1140, which may be referred to as a contour electrode, comprising a first top comb electrode 1010 and second top comb electrode 1020. The first top comb electrode 110 includes a first top bus bar 1015 and multiple representative first top fingers 1011 and 1012, separated by first space 1016. The first top fingers 1011 and 1012 extend in a first direction from the first top bus bar 1015 (e.g., left to right in the illustrative orientation). The second top comb electrode 1020 similarly includes a second top bus bar 1025 and multiple second top comb extensions or top comb-like fingers, indicated by representative second top fingers 1021 and 1022, separated by second space 1026. The second top fingers 1021 and 1022 extend in a second direction, opposite the first direction, from the second top bus bar 1025 (e.g., right to left in the illustrative orientation). The first top comb electrode 1010 is a signal electrode to which an electrical signal is applied, and the second top comb electrode 1020 is a floating electrode providing an output for the electrical signal.

The top electrode 1140 is interdigitated in that the first top fingers 1011 and 1012 extend into the second space 1126 between the second top fingers 121 and 122, and the second top fingers 121 and 122 extend into the first space 1116 between the first top fingers 1011 and 1012. This arrangement forms a top interleaving pattern of the LCRF device 1100. The alternating first and second top fingers 1011, 1021 and 1012, 1022 are likewise separated by spaces or gaps 1018, respectively. In the depicted embodiment, a top surface of a piezoelectric layer 1130 (discussed below) is visible through the gaps 1018.

In addition, each of the first and second top electrode fingers 1011, 1012, 1021 and 1022 are separated from the piezoelectric layer by corresponding support pillars (discussed below). The support pillars may be formed from the material of the first and second top electrode fingers 1011, 1012, 1021 and 1022 extending from the bottom surfaces of the first and second top fingers 1011, 1012, 1021 and 1022, respectively (e.g., FIG. 11A), leaving corresponding depressions in the top surfaces of the first and second top electrode fingers 1011, 1012, 1021 and 1022. Alternatively, the support pillars may be formed from the material of the piezoelectric layer 1130, over which the first and second top electrode fingers 1011, 1012, 1021 and 1022, extending from the bottom surface of the piezoelectric layer 1130, respectively (e.g., FIG. 11B), again leaving corresponding depressions in the top surfaces of the first and second top electrode fingers 1011, 1012, 1021 and 1022, which are transferred from corresponding depressions in the piezoelectric layer 1130 formed below the first and second top electrode fingers 1011, 1012, 1021 and 1022. For example, as shown in FIG. 10, the first top electrode finger 1011 includes depressions 1011a and 1011b, the second top electrode finger 1021 includes depressions 1021a and 1021b, the first top electrode finger 1012 includes depressions 1012a and 1012b, and the second top electrode finger 1022 includes depressions 1022a and 1022b.

FIGS. 11A to 11D are cross-sectional diagrams, taken along line A-A' of FIG. 10, illustrating LCRF devices, according to representative embodiments. Each of the LCRF devices shown in FIGS. 11A to 11D includes a single bottom electrode, thus depicting a single-ended LCRF filter configuration.

Figure 11A:
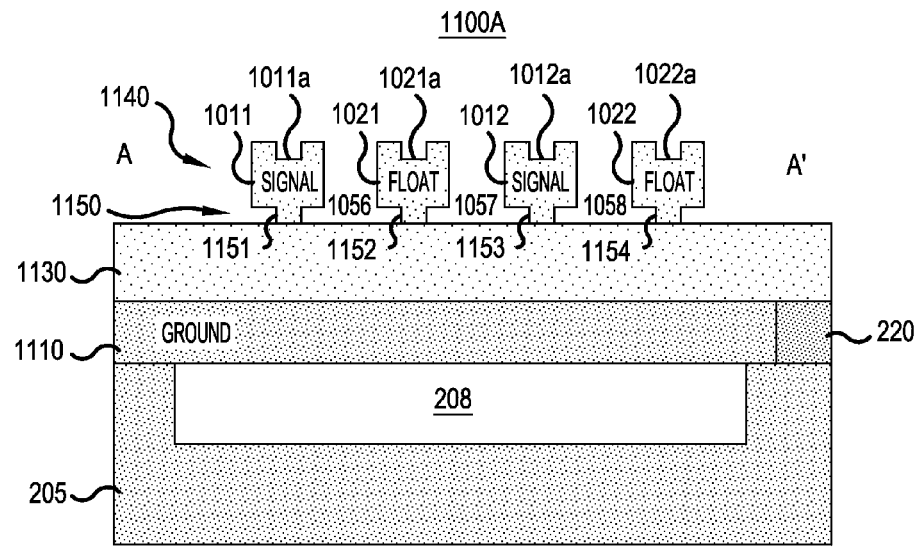
FIGS. 11A-11D are cross-sectional views of the LCRF in FIG. 10 taken along a line A-A', according to various embodiments.

Referring to FIG. 11A, LCRF device 1100A includes substrate 205 defining cavity 208 (e.g., air cavity), which serves as an acoustic reflector. The LCRF device 1100A further includes a bottom electrode 1110 disposed on the substrate 205 over the cavity 208, a planarization layer 220 (optional) disposed adjacent to bottom electrode 1110 on the substrate 205, a piezoelectric layer 1130 disposed on the bottom electrode 1110 and the planarization layer 220, and a top (contour) electrode 1140 disposed over the piezoelectric layer 1130. In addition, the LCRF device 1100A includes a set of support pillars 1150 positioned between the piezoelectric layer 1130 and the top electrode 1140. The set of support pillars 1150 includes representative support pillars 1151, 1152, 1153 and 1154, separating the top electrode 1140 from and the piezoelectric layer 1130. As mentioned above, the support pillars 1151, 1152, 1153 and 1154 extend from the bottom surfaces of the first top electrode finger 1011, the second top electrode finger 1012, the first top electrode finger 1021 and the second top electrode finger 1022, respectively, leaving corresponding depressions 1011a, 1021a, 1012a and 1022a.

More particularly, the support pillars 1151-1154 are configured such that air-gaps 1156, 1157 and 1158 are arranged between a top surface of the piezoelectric layer 1130 and a bottom surface of each of the first top fingers 1011, 1012 and the second top fingers 1021, 1022. The air-gaps 1156-1158, together with the cavity 208, enable movement (or vibration) of the piezoelectric layer 1130 in a vertical direction substantially without mass-loading effect of the top electrode 1140. Notably, though, some residual mass-loading effect resulting from finite area of support pillars 1150 may be present, albeit at significantly lower frequency than the passband of the LCRF device 1100A. Collectively, the bottom electrode 1110, the piezoelectric layer 1130, and the top electrode 1140 constitute an acoustic stack of the LCRF device 1100A. Also, overlapping portions of the bottom electrode 1110, the piezoelectric layer 1130, the air-gaps 1156-1158 and the top electrode 1140 over the cavity 208 define a main membrane region of the LCRF device 1100A.

As stated above, the first top comb electrode 1010 is a signal electrode to which an electrical signal is applied, and the second top comb electrode 1020 is a floating electrode providing an output for the electrical signal. Therefore, as shown in FIGS. 10 and 11A, the first top fingers 1011 and 1012 receive the input electrical signal, and the second top fingers 1021 and 1022 are floating. Meanwhile, the bottom electrode 1110 is grounded. Also, although not shown, a passivation layer may be present on top of top electrode 1140 (and in each embodiment discussed herein) with thickness sufficient to insulate all layers of the acoustic stack from the environment, including protection from moisture, corrosives, contaminants, debris and the like.

In various embodiments, the support pillars 1151-1154, defining the air-gaps 1156-1158, are formed by applying a layer of sacrificial material, such as phosphosilicate glass (PSG), on the top surface of the piezoelectric layer 1130, then planarizing the layer of sacrificial material using a chemical-mechanical polishing (CMP) process, for example. The layer of sacrificial material is then patterned using a mask and etched to provide openings corresponding to the desired locations of the support pillars, e.g., the support pillars 1151-1154. The etch mask is removed, and the first and second top comb electrodes 1010 and 1020 are formed on the top surface of the layer of sacrificial material, such that the conductive material (e.g., metal) forming the first and second top comb electrodes fill the openings corresponding to the desired locations of the support pillars, thereby creating the depressions corresponding to the support pillars, e.g., including the representative depressions 1011a, 1011b, 1021a, 1021b, 1012a, 1012b, 1022a and 1022b. The layer of sacrificial material is then removed, leaving the support pillars, e.g., the support pillars 1151-1154, separated by air-gaps, e.g., air-gaps 1156-1158.

The air-gaps 1156-1158 may have a height (in the vertical direction) less than or equal to about 1000 Å, for example, and in some embodiments, less than or equal to about 500 Å. However, thicker air-gaps may be incorporated, without departing from the scope of the present teachings. The above descriptions of the support pillars 1151-1154 and corresponding air-gaps 1156-1158 equally apply to the other support pillars and corresponding air-gaps identified herein, and therefore may not be repeated.

Figure 11B:
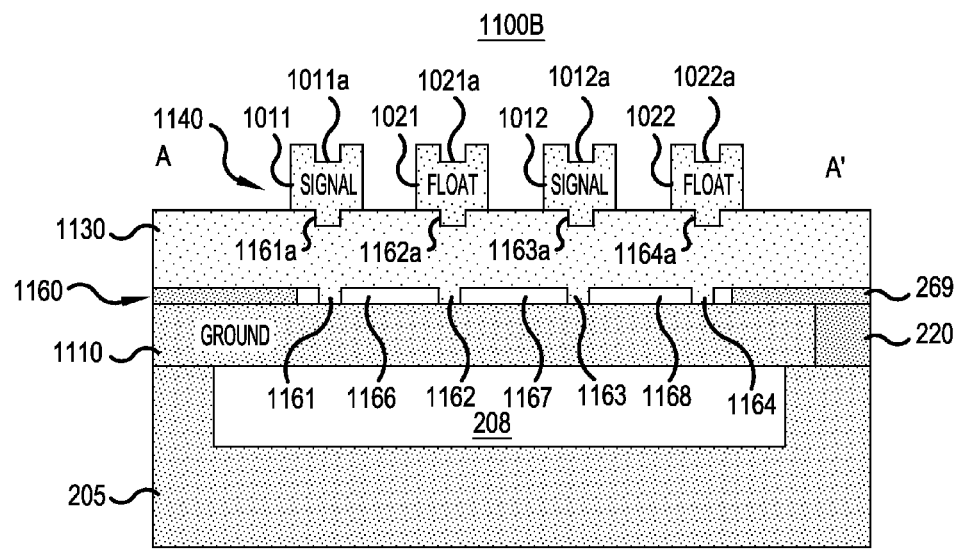

Referring to FIG. 11B, LCRF device 1100B includes the substrate 205 defining the cavity 208, the bottom electrode 1110 disposed on the substrate 205 over the cavity 208, the planarization layer 220 (optional) disposed adjacent to bottom electrode 1110 on the substrate 205, the piezoelectric layer 1130 disposed over the bottom electrode 1110 and the planarization layer 220, and the top electrode 1140 disposed on the piezoelectric layer 1130. The LCRF device 1100B further includes a set of support pillars 1160 positioned between the piezoelectric layer 1130 and the bottom electrode 1110. The set of support pillars 1160 includes representative support pillars 1161, 1162, 1163 and 1164, which create air-gaps 1166, 1167 and 1168, separating the piezoelectric layer 1130 from the bottom electrode 1110. In the depicted embodiment, the support pillars 1161, 1162, 1163 and 1164 extend from the bottom surface of the piezoelectric layer 1130, and thus are formed of the same material of which the piezoelectric layer is formed. The formation of the support pillars 1161, 1162, 1163 and 1164 extending downward toward the bottom electrode 1110 leaves corresponding depressions in the top surface of the piezoelectric layer 1130, indicated by representative depressions 1161a, 1162a, 1163a, which in turn result (by transfer trough the piezoelectric layer 1130) in formation of the depressions 1011a, 1021a, 1012a and 1022a, respectively, in the top surfaces of the first and second top electrode fingers 1011, 1012, 1021 and 1022.

In an alternative embodiment (not shown), the support pillars extending from the bottom surface of the piezoelectric material 1130 may be offset from the first and second electrode fingers 1011, 1012, 1021 and 1022, such that the corresponding depressions in the top surface of the piezoelectric layer 1130 occur between adjacent first and second electrode fingers 1011, 1012, 1021 and 1022. In this case, there are no corresponding depressions in the top surfaces of the first and second electrode fingers 1011, 1012, 1021 and 1022 transferred through the piezoelectric layer 1130.

The support pillars 1161-1164 are configured such that air-gaps 1166-1168 are arranged between a bottom surface of the piezoelectric layer 1130 and a top surface of the bottom electrode 1110. The air-gaps 1166-1168, together with the cavity 208, enable movement (or vibration) of the piezoelectric layer 1130 in a vertical (as opposed to lateral) direction. As discussed above with respect to support frames 260, 460, 660 and 960, the presence of the air-gaps 1166-1168 directly below the piezoelectric layer 1130 and above the bottom electrode 1110 makes the cavity 208 optional. In various embodiments, an additional support layer 269, having the same thickness as the air-gaps 1166-1168, may be formed at the outer edge regions of the LCRF device 1100B between the piezoelectric layer 1130 and the bottom electrode 1110 to provide additional structural support. The additional support layer 269 may be formed of a dielectric material, such as NEBSG or non-conductive SiC. The dielectric material may be deposited on the top surface of the ground electrode 1110 and the planarization layer 220, then patterned and etched to provide space for subsequent formation of the set of support pillars 1160. The space may be filled with sacrificial material, such as PSG, also patterned and etched to provide spaces for the individual support pillars 1161-1164, and then planarized. The piezoelectric layer 1130 may then be deposited over the bottom electrode 1110 and on the planarized top surface of the additional support layer 269 and the sacrificial material, which is subsequently removed to leave the air-gaps 1166-1168.

Notably, reference to the air-gaps 1166-1168 implies that they are "filled" with air. However, this terminology is used for the sake of convenience and is not intended to be limiting. That is, it is understood that the air-gaps 1166-1168 (as well as the other air-gaps identified herein) may constitute a vacuum, be filled with one or more gases other than air, or be filled with dielectric or metal material, to provide the desirably large acoustic impedance discontinuity depending on the specific implementation, without departing from the scope of the present teachings. The air-gaps 1166-1168 may have a height (in the vertical direction) less than or equal to about 1000 Å, for example, and in some embodiments, less than or equal to about 300 Å. However, thicker air-gaps may be incorporated, without departing from the scope of the present teachings. The above descriptions of the support pillars 1161-1164 and corresponding air-gaps 1166-1168 equally apply to the other support pillars and corresponding air-gaps identified herein, and therefore may not be repeated.

Figure 11C:
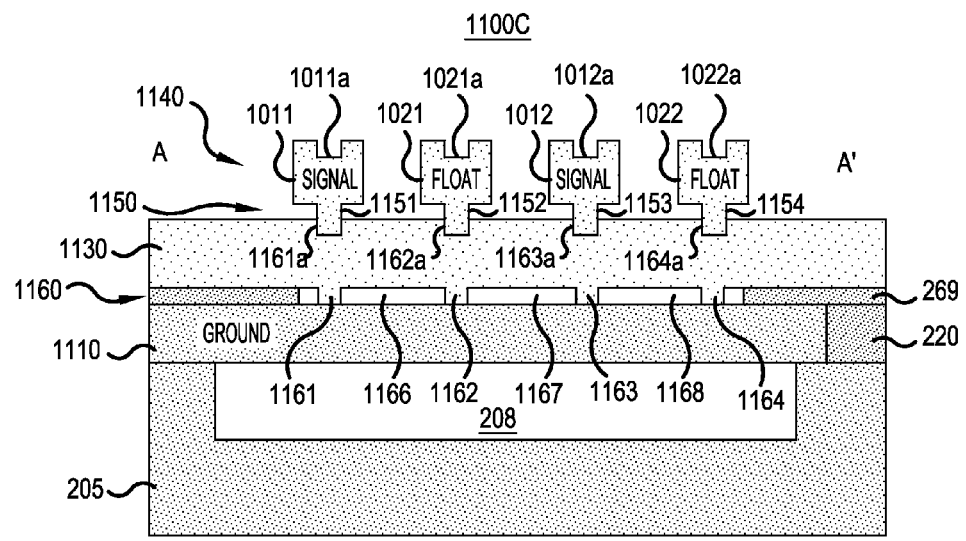

Referring to FIG. 11C, LCRF device 1100C substantially combines the configurations of the single-ended LCRF devices 1100A and 1100B. That is, the LCRF device 1100C includes both the support pillars 1151-1154 positioned between the piezoelectric layer 1130 and the top electrode 1140, and the support pillars 1161-1164 positioned between the piezoelectric layer 1130 and the bottom electrode 1110 (and the planarization layer 220). Again, the presence of the air-gaps 1166-1168 directly below the piezoelectric layer 1130 and above the bottom electrode 1110 makes the cavity 208 optional, regardless of the presence of the top support pillars 1151-1154 and corresponding air-gaps 1156-1158.

Figure 11D:
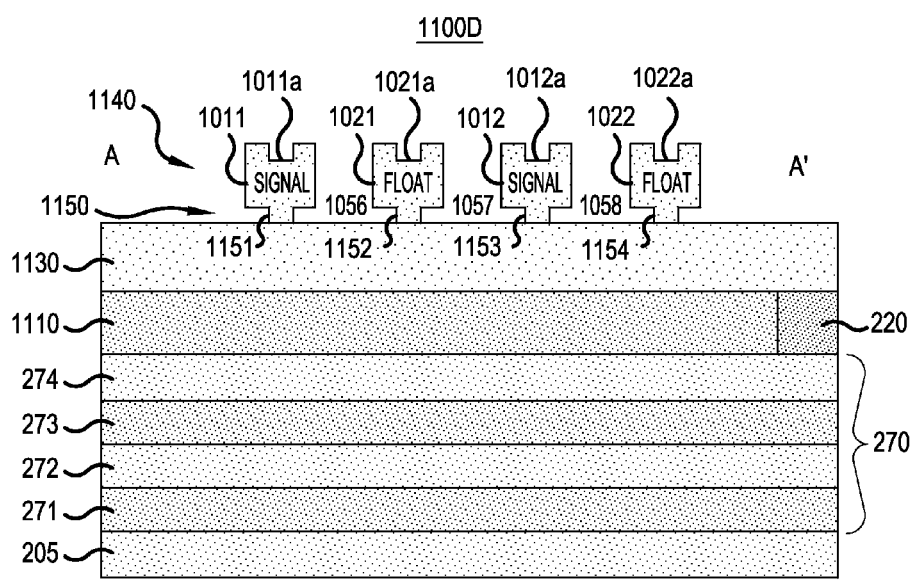

Referring to FIG. 11D, LCRF device 1100D is substantially the same as LCRF device 1100A, except that the acoustic reflector is implemented as an acoustic mirror, such as the representative DBR 270, as opposed to the cavity 208. In this configuration, the DBR 270 is disposed on the substrate 205, the bottom electrode 1110 is disposed on the DBR 270, the planarization layer 220 (optional) is disposed adjacent to bottom electrode 1110 on the DBR 270, the piezoelectric layer 1130 is disposed on the bottom electrode 1110 and the planarization layer 220, and the top electrode 1140 is disposed over the piezoelectric layer 1130. In addition, the LCRF device 1100D includes the support pillars 1151-1154 and corresponding air-gaps 1156-1158 between the piezoelectric layer 1130 and the top electrode 1140. The LCRF device 1100D is therefore effectively a solidly mounted LCRF device. Of course, the DBR 270 may likewise be substituted for the cavity 208 in the LCRF devices 1100B and 1100C, without departing from the scope of the present teachings.

Figure 12:
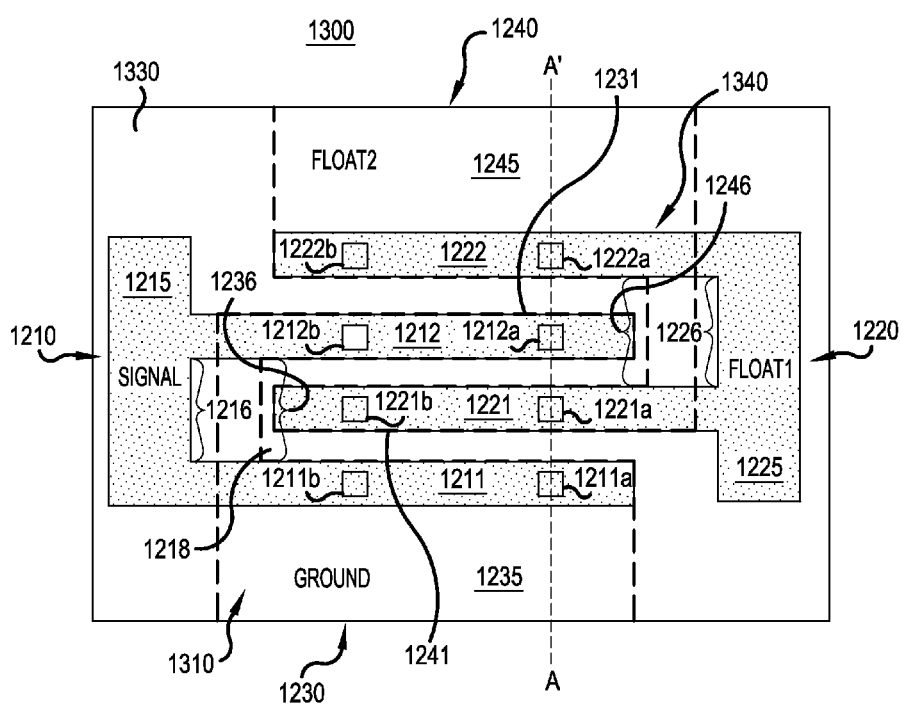
FIG. 12 is a top plan view of a LCRF device with at least one set of supporting pillars, according to a representative embodiment.

FIG. 12 is a top plan view of a LCRF device with at least one set of supporting pillars, according to a representative embodiment, and FIGS. 13A-13D are cross-sectional views of the LCRF in FIG. 3 taken along a line A-A' according to different embodiments. More particularly, FIG. 12 depicts LCRF device 1300, which is a differential LRCF (as opposed a single-ended LCRF, discussed above). The cross-sectional views correspond to different variations of the differential LCRF device 1300, respectively, as LCRF devices 1300A-1300D, which may be referred to as CCEs. The LCRF devices 1300A-1300D have many of the same features, so a repetitive description of these features may be omitted in an effort to avoid redundancy.

Referring to FIG. 12, LCRF device 1300 includes a top electrode 1340 (or top contour electrode) comprising a first top comb electrode 1210 and second top comb electrode 1220. The first top comb electrode 1210 includes a first top bus bar 1215 and multiple representative first top fingers 1211 and 1212, separated by first space 1216. The first top fingers 1211 and 1212 extend in a first direction from the first top bus bar 1215. The second top comb electrode 1220 similarly includes a second top bus bar 1225 and multiple second top fingers 1221 and 1222, separated by second space 1226. The second top fingers 1221 and 1222 extend in a second direction, opposite the first direction, from the second top bus bar 1225. The first top comb electrode 1210 is a signal electrode to which an electrical signal is applied, and the second top comb electrode 1220 is a top (first) floating electrode providing an output for the electrical signal.

The top electrode 1340 is interdigitated in that the first top finger 1212 extends into the second space 1226 between the second top fingers 1221 and 1222, and the second top finger 1221 extends into the first space 1216 between the first top fingers 1211 and 1212, creating top interleaving pattern. The alternating first and second top fingers 1211, 1221, 1212, and 1222 are likewise separated by spaces or gaps 1218, respectively. In the depicted embodiment, a top surface of a piezoelectric layer 1330 (discussed below) is visible through the gaps 1218.

The LCRF device 1300 further includes a bottom electrode 1310 (or bottom contour electrode) comprising a first bottom comb electrode 1230 and second bottom comb electrode 1240. The first bottom comb electrode 1230 includes a first bottom bus bar 1235 and at least one first bottom finger 1231, which is separated from the first bottom bus bar 1235 by first space 1236. The first bottom finger 1231 extends in a first direction away from the first top bus bar 1215. The second bottom comb electrode 1240 similarly includes a second bottom bus bar 1245 and at least one representative second bottom finger 1241, which is separated from the second bottom bus bar 1245 by second space 1246. The second bottom finger 1241 extends in a second direction, opposite the first direction, away from the second top bus bar 1225. The first bottom electrode 1230 is a ground electrode connected to ground, and the second bottom electrode 1240 is a bottom (second) floating electrode providing another output for the electrical signal. The bottom electrode 1310 is likewise interdigitated in that the first bottom finger 1231 extends into the second space 1246, and the second bottom finger 1241 extends into the first space 1236, creating a bottom interleaving pattern of the LCRF device 1300.

FIGS. 13A to 13D are cross-sectional diagrams, taken along line A-A' of FIG. 12, illustrating LCRF devices, according to representative embodiments. Each of the LCRF devices shown in FIGS. 13A to 13D includes a bottom contour electrode having a bottom interleaving pattern, thus depicting a differential LCRF filter configuration.

Figure 13A:
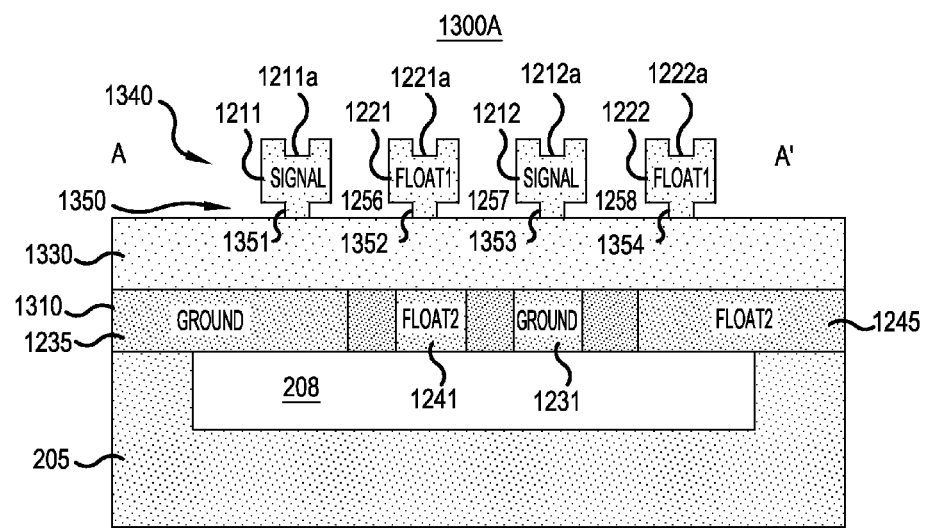
FIGS. 13A-13D are cross-sectional views of the LCRF in FIG. 12 taken along a line A-A', according to various representative embodiments.

Referring to FIG. 13A, LCRF device 1300A includes substrate 205 defining a cavity 208 (e.g., air cavity), the bottom (contour) electrode 1310 disposed on the substrate 205 over the cavity 208, a piezoelectric layer 1330 disposed on the bottom electrode 1310, and a top electrode 1340 disposed over the piezoelectric layer 1330. (Although not shown, a planarization layer may be included adjacent the bottom electrode 1310, as needed, in this and the other embodiments.) In addition, the LCRF device 1300A includes device a set of support pillars 1350 positioned between the piezoelectric layer 1330 and the top electrode 1340. The set of support pillars 1350 includes representative support pillars 1351, 1352, 1353 and 1354, separating the top electrode 1340 from and the piezoelectric layer 1330. The support pillars 1351-1354 include corresponding depressions 1211a, 1221a, 1212a and 1222a, respectively, for reasons discussed above with reference to support pillars 1151-1154. The support pillars 1351-1354 are configured such that air-gaps 1356, 1357 and 1358 are arranged between a top surface of the piezoelectric layer 1330 and a bottom surface of each of the first top fingers 1211, 1212 and the second top fingers 1221, 1222.

As stated above, the first top comb electrode 1210 is a top signal electrode to which an electrical signal is applied, and the second top comb electrode 1220 is a top floating electrode providing an output for the electrical signal. In addition, the first bottom comb electrode 1230 is a ground electrode, and the second bottom comb electrode 1240 is a bottom floating electrode providing another output for the electrical signal. Therefore, as shown in FIG. 13A, the first top fingers 1211 and 1212 receive the input electrical signal, the second top fingers 1221 and 1222 and the second bottom finger 1241 are floating, and the first bottom finger 1231 is grounded. In the depicted embodiment, the spaces between the first and second bottom bus bars 1235 and 1245 and the first and second bottom fingers 1231 and 1241 of the bottom electrode 1310 are filled with a dielectric material (as opposed to being air spaces), such as NEBSG or non-conductive SiC, for example. These filled spaces include space 1233 between the first bottom bus bar 1235 and the second bottom finger 1241, space 1234 between the second bottom finger 1241 and the first bottom finger 1231, and space 1235 between the first bottom finger 1231 and the second bottom bus bar 1245. The spaces 1233-1235 are at least partially aligned with the gaps 1218 between the first top fingers 1211, 1212 and the second top fingers 1221, 1222, respectively. Also, the first bottom finger 1231 is at least partially aligned with the first top finger 1212, and the second bottom finger 1241 is at least partially aligned with the second top finger 1221. However, the relative placements of the bottom spaces 1233-1235 and the top gaps 1218, as well as the relative placements the first and second bottom fingers 1231, 1241 and the first and second top fingers 1211, 1212, 1221, 1222, may vary without departing from the scope of the present teachings.

Figure 13B:
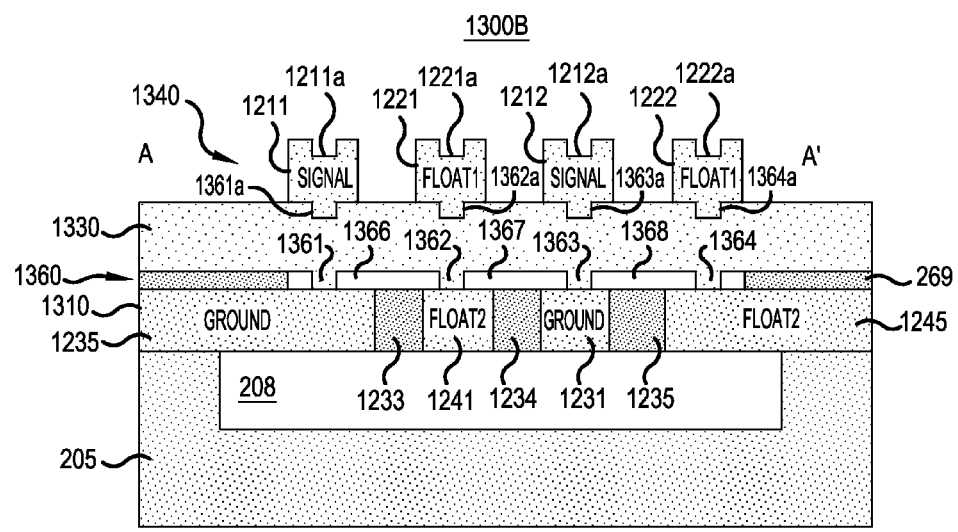

Referring to FIG. 13B, LCRF device 1300B includes the substrate 205 defining the cavity 208, the bottom electrode 1310 disposed on the substrate 205 over the cavity 208, the piezoelectric layer 1330 disposed over the bottom electrode 1310, and the top electrode 1340 disposed on the piezoelectric layer 1330. The LCRF device 1300B further includes a set of support pillars 1360 positioned between the piezoelectric layer 1330 and the bottom electrode 1310. The set of support pillars 1360 includes representative support pillars 1361, 1362, 1363 and 1364, which create air-gaps 1366, 1367 and 1368, separating the piezoelectric layer 1330 from the bottom electrode 1310. The formation of the support pillars 1361, 1362, 1363 and 1364 extending downward toward the bottom electrode 1310 leaves corresponding depressions in the top surface of the piezoelectric layer 1330, indicated by representative depressions 1361a, 1362a, 1363a, as discussed above with reference to support pillars 1161-1164 in FIG. 11B. In an alternative embodiment (not shown), the support pillars extending from the bottom surface of the piezoelectric material 1330 may be offset from the first and second electrode fingers 1211, 1212, 1221 and 1222.

Figure 13C:
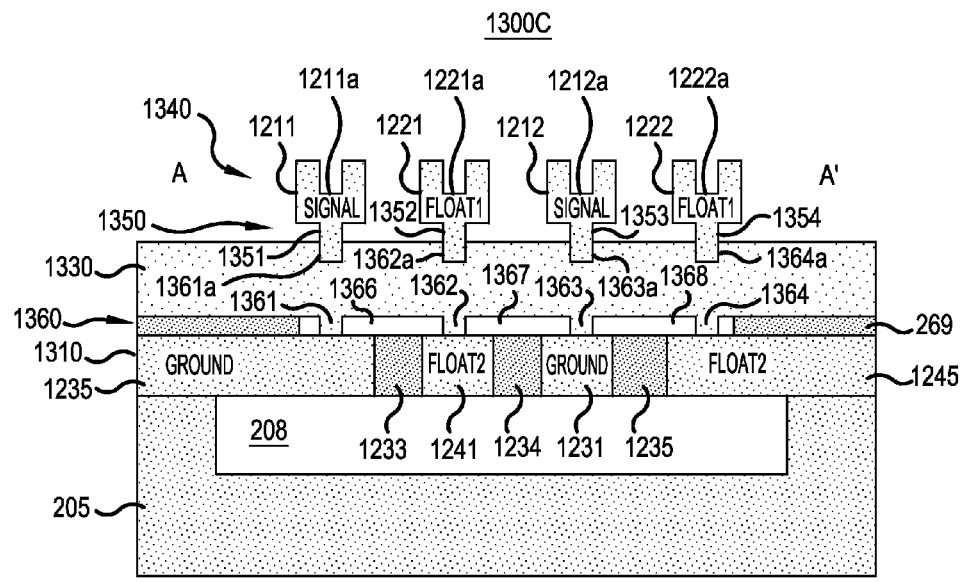
Figure 13D:
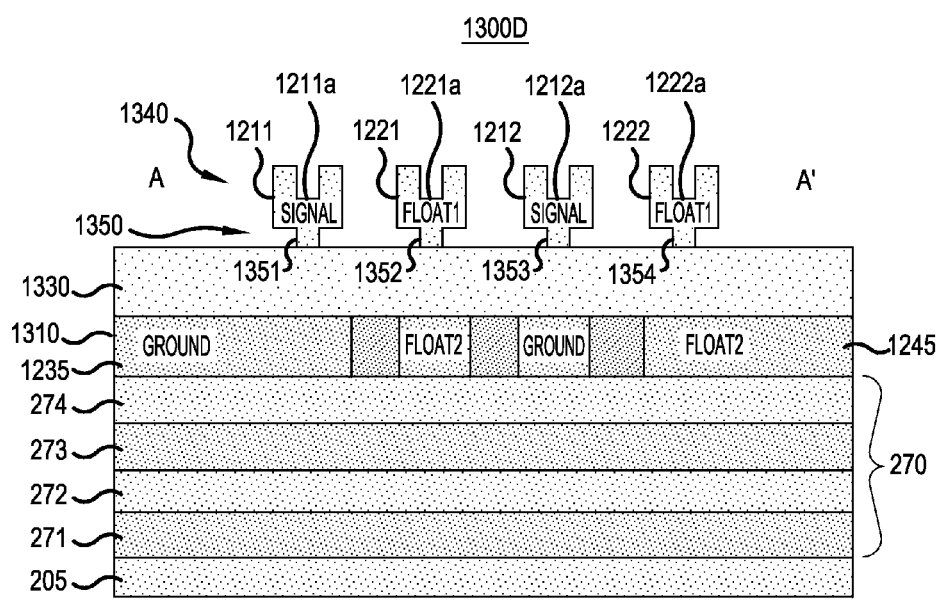

Referring to FIG. 13C, LCRF device 1300C substantially combines the configurations of the differential LCRF devices 1300A and 1300B. That is, the LCRF device 1300C includes both the support pillars 1351-1354 positioned between the piezoelectric layer 1330 and the top electrode 1340, and the support pillars 1361-1364 positioned between the piezoelectric layer 1330 and the bottom electrode 1310 (and the planarization layer 220). Referring to FIG. 13D, LCRF device 1300D is substantially the same as LCRF device 1300A, except that the acoustic reflector is implemented as an acoustic mirror, such as the representative DBR 270, as opposed to the cavity 208. The LCRF device 1300D is therefore effectively a solidly mounted LCRF device. Of course, the DBR 270 may likewise be substituted for the cavity 208 in the LCRF devices 1300B and 1300C, without departing from the scope of the present teachings.

Figure 14:
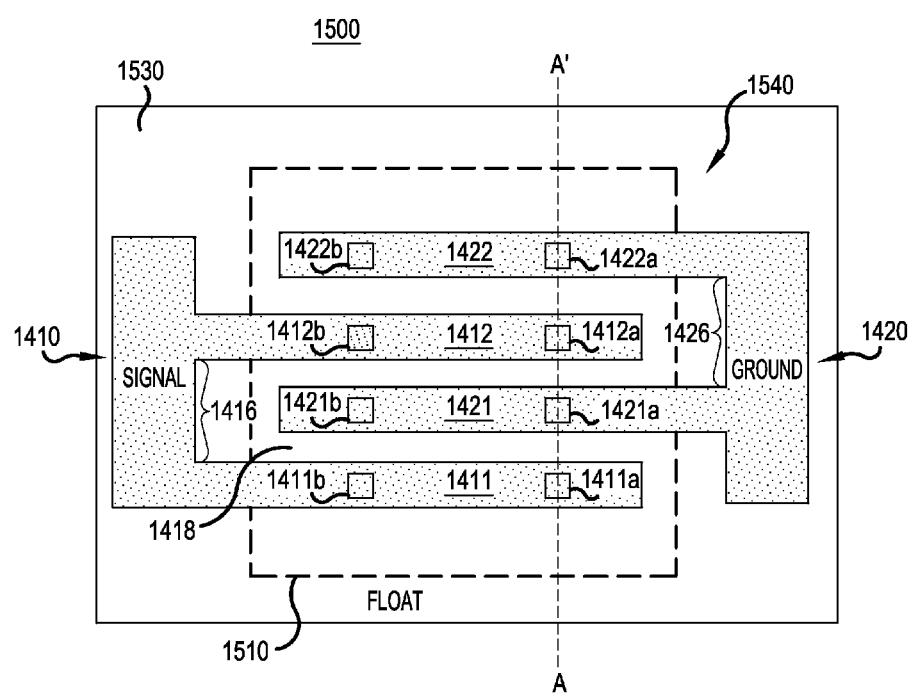
FIG. 14 is a top plan view of a LFE-CMR device with at least one set of supporting pillars, according to a representative embodiment.

FIG. 14 is a top plan view of a lateral-field-excitation (LFE) contour mode resonator (CMR) device with at least one set of supporting pillars, according to a representative embodiment, and FIGS. 15A-15D are cross-sectional views of the LFE-CMR device in FIG. 14 taken along a line A-A' according to different embodiments. More particularly, the cross-sectional views correspond to different variations of the LFE-CMR device 1500, respectively, as LFE-CMR devices 1500A-1500D. The LFE-CMR devices 1500A-1500D have many of the same features, so a repetitive description of these features may be omitted in an effort to avoid redundancy.

Referring to FIG. 14, LFE-CMR device 1500 includes a top electrode 1540, comprising a first top comb electrode 1410 and second top comb electrode 1420. The first top comb electrode 1410 includes a first top bus bar 1415 and multiple representative first top fingers 1411 and 1412, separated by first space 1416. The second top comb electrode 1420 similarly includes a second top bus bar 1425 and multiple representative second top fingers 1421 and 1422, separated by second space 1426, and extending in a direction opposite the first top fingers 1421 and 1422. The first top comb electrode 1410 is a signal electrode to which an electrical signal is applied, and the second top comb electrode 1420 is a ground electrode (as opposed to a floating electrode), connected to ground. The top electrode 1540 is interdigitated, forming a top interleaving pattern. The alternating first and second top fingers 1411, 1421, 1412, and 1422 are likewise separated by spaces or gaps 1418, respectively. In the depicted embodiment, a top surface of a piezoelectric layer 1530 (discussed below) is visible through the gaps 518.

FIGS. 15A to 15D are cross-sectional diagrams, taken along line A-A' of FIG. 14, illustrating LFE-CMR devices, according to representative embodiments. Each of the LFE-CMR devices shown in FIGS. 15A to 15D includes a single bottom electrode, thus depicting the LFE configuration.

Figure 15A:
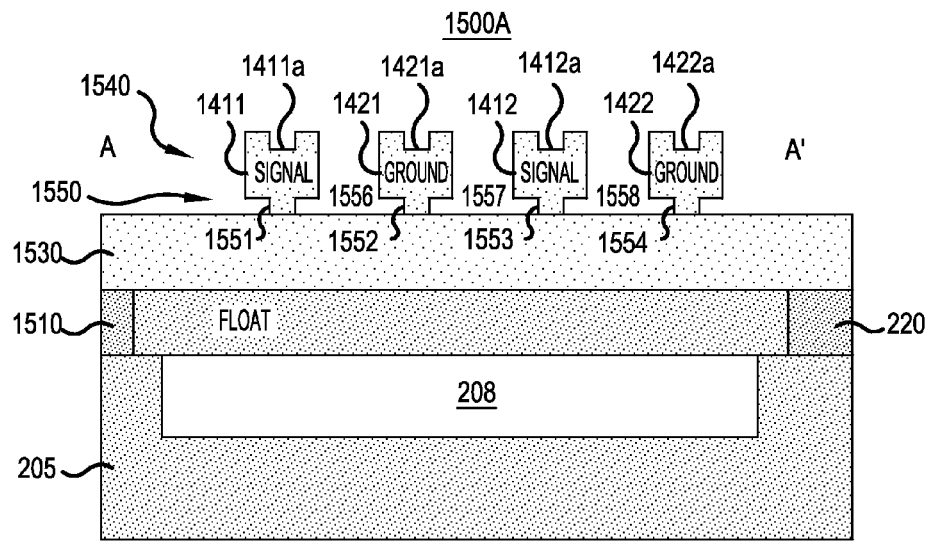
FIGS. 15A-15D are cross-sectional views of the LFE-CMR device in FIG. 14 taken along a line A-A', according to various representative embodiments.

Referring to FIG. 15A, LFE-CMR device 1500A includes substrate 205 defining cavity 208 (e.g., air cavity), a bottom electrode 1510 disposed on the substrate 205 over the cavity 208, a planarization layer 220 (optional) disposed adjacent to bottom electrode 1510 on the substrate 205, a piezoelectric layer 1530 disposed on the bottom electrode 1510 and the planarization layer 220, and a top (contour) electrode 1540 disposed over the piezoelectric layer 1530. In addition, the LFE-CMR device 1500A includes a set of support pillars 1550 positioned between the piezoelectric layer 1530 and the top electrode 1540. The set of support pillars 1550 includes representative support pillars 1551, 1552, 1553 and 1554, separating the top electrode 1540 from and the piezoelectric layer 1530. The support pillars 1551-1554 include corresponding depressions 1411a, 1421a, 1412a and 1422a, respectively, for reasons discussed above with reference to support pillars 1151-1154. The support pillars 1551-1554 are configured such that air-gaps 1556, 1557 and 1558 are arranged between a top surface of the piezoelectric layer 1530 and a bottom surface of each of the first top fingers 1411, 1412 and the second top fingers 1421, 1422. As stated above, the first top comb electrode 1410 is a signal electrode to which an electrical signal is applied, and the second top comb electrode 1420 is a ground electrode connected to ground. Meanwhile, the bottom electrode 1510 is floating.

Figure 15B:
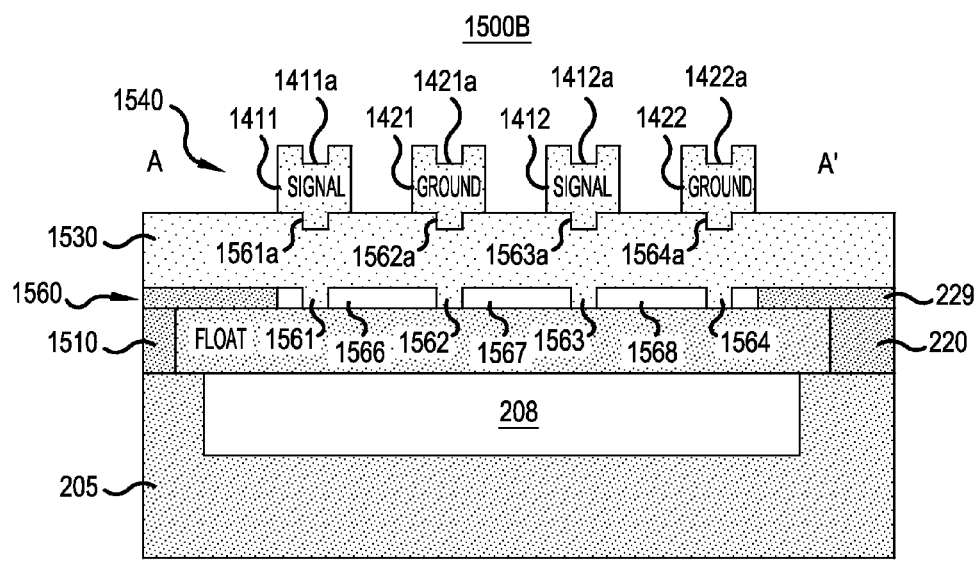

Referring to FIG. 15B, LFE-CMR device 1500B includes the substrate 205 defining the cavity 208, the bottom electrode 1510 disposed on the substrate 205 over the cavity 208, the planarization layer 220 (optional) disposed adjacent to bottom electrode 1510 on the substrate 205, the piezoelectric layer 1530 disposed over the bottom electrode 1510 and the planarization layer 220, and the top electrode 1540 disposed on the piezoelectric layer 1530. The LFE-CMR device 1500B further includes a set of support pillars 1560 positioned between the piezoelectric layer 1530 and the bottom electrode 1510. The set of support pillars 1560 includes representative support pillars 1561-1564, which create air-gaps 1566, 1567 and 1568, separating the piezoelectric layer 1530 from the bottom electrode 1510. In the depicted embodiment, the support pillars 1561, 1562, 1563 and 1564 result in corresponding depressions in the top surface of the piezoelectric layer 1530, indicated by representative depressions 1561a, 1562a, 1563a, which in turn result (by transfer trough the piezoelectric layer 1530) in formation of the depressions 1411a, 1421a, 1412a and 1422a, respectively, in the top surfaces of the first and second top electrode fingers 1411, 1412, 1421 and 1422, as discussed above. In an alternative embodiment (not shown), the support pillars extending from the bottom surface of the piezoelectric material 1530 may be offset from the first and second electrode fingers 1411, 1412, 1421 and 1422, as discussed above. Again, the presence of the air-gaps 1566-1568 directly below the piezoelectric layer 1530 and above the bottom electrode 1510 makes the cavity 208 optional.

Figure 15C:
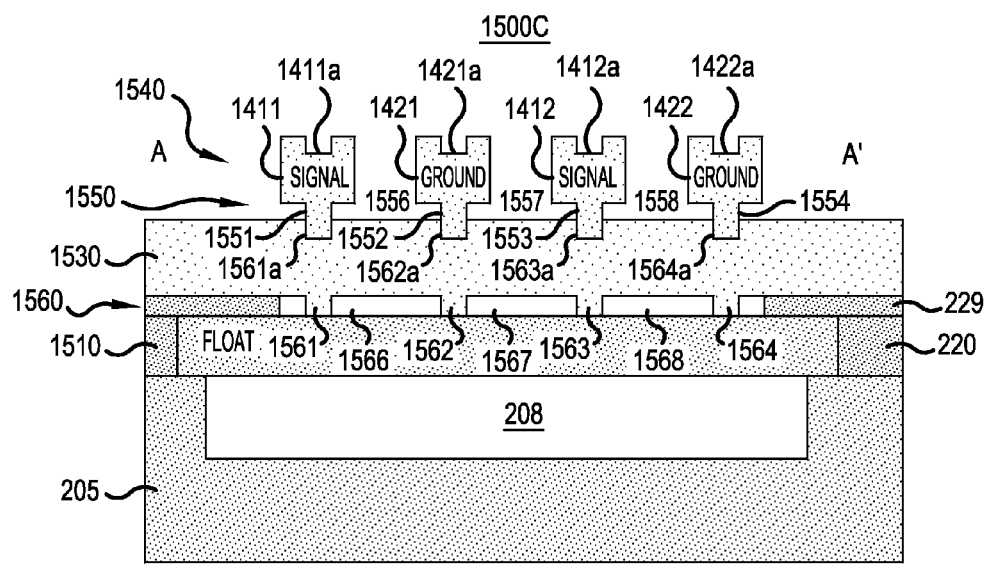
Figure 15D:
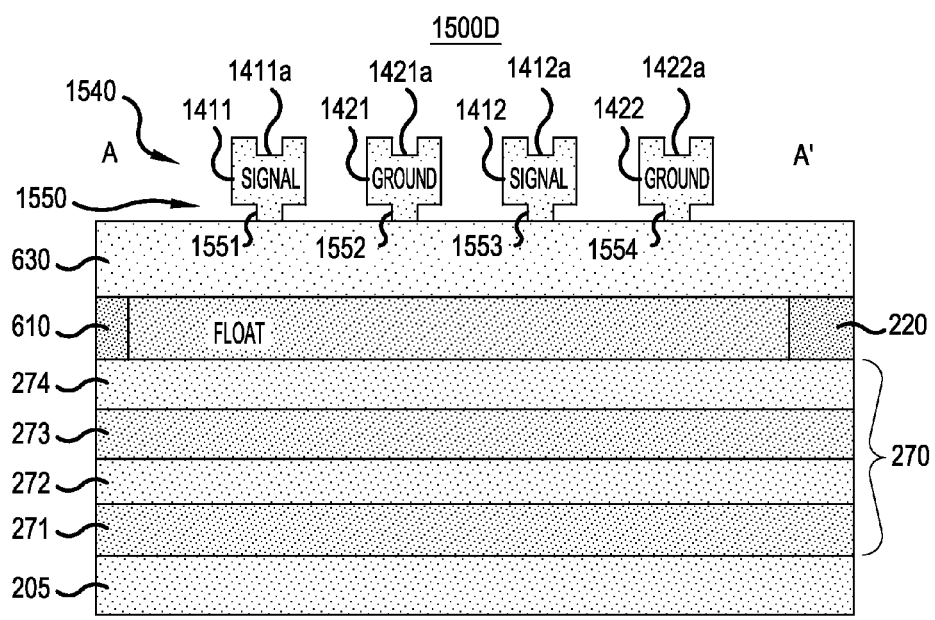

Referring to FIG. 15C, LFE-CMR device 1500C substantially combines the configurations of the LFE-CMR devices 1500A and 1500B. That is, the LFE-CMR device 1500C includes both the support pillars 1551-1554 positioned between the piezoelectric layer 1530 and the top electrode 1540, and the support pillars 1561-1564 positioned between the piezoelectric layer 1530 and the bottom electrode 1510 (and the planarization layer 220). Referring to FIG. 11D, LFE-CMR device 1500D is substantially the same as LFE-CMR device 1500A, except that the acoustic reflector is implemented as an acoustic mirror, such as the representative DBR 270, as opposed to the cavity 208. The LFE-CMR device 1500D is therefore effectively a solidly mounted LFE-CMR device. Of course, the DBR 270 may likewise be substituted for the cavity 208 in the LFE-CMR devices 1500B and 1500C, without departing from the scope of the present teachings.

Figure 16A:
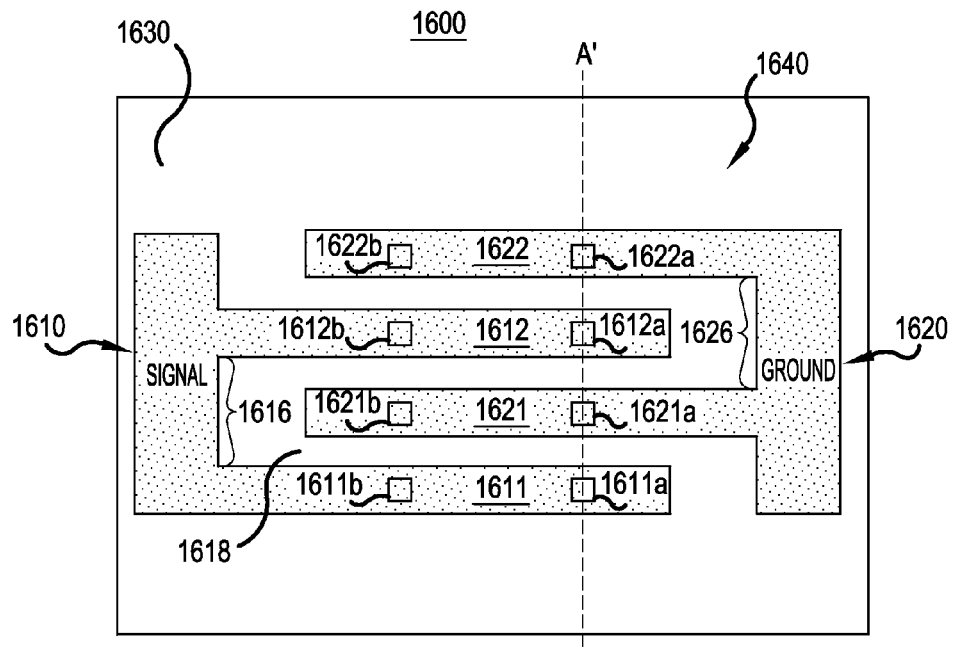
FIG. 16A is a top plan view of a LFE-CMR device with at least one set of supporting pillars and no bottom metal layer, according to a representative embodiment.
Figure 16B:
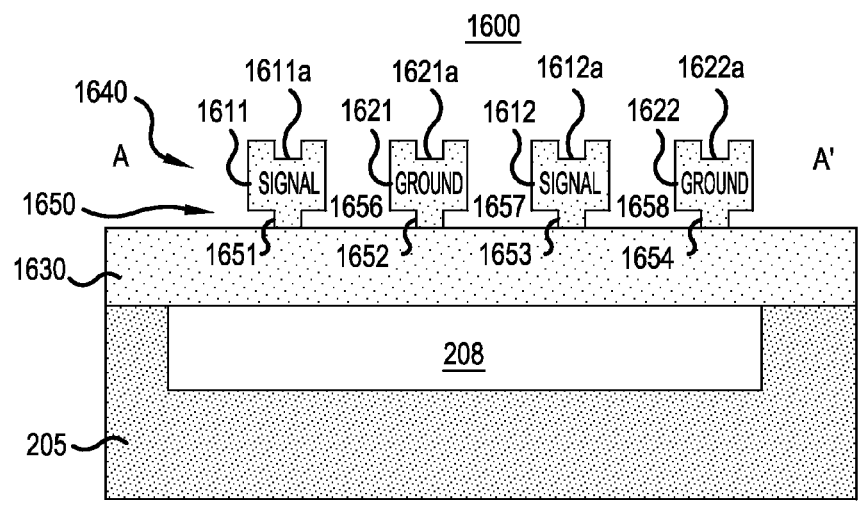
FIG. 16B is a cross-sectional view of the LFE-CMR device in FIG. 16A taken along a line A-A', according to the representative embodiment.

FIG. 16A is a top plan view of a lateral-field-excitation (LFE) contour mode resonator (CMR) device with at least one set of supporting pillars and no bottom metal, according to a representative embodiment. FIG. 16B is a cross-sectional view of the LFE-CMR device in FIG. 16A taken along a line A-A', according to the representative embodiment.

Referring to FIGS. 16A and 16B, LFE-CMR device 1600 includes a top electrode 1640, which may be referred to as a contour electrode, comprising a first top comb electrode 1610 and second top comb electrode 1620. The first top comb electrode 1610 includes a first top bus bar 1615 and multiple representative first top fingers 1611 and 1612 separated by first space 1616. The second top comb electrode 1620 similarly includes a second top bus bar 1625 and multiple representative second top fingers 1621 and 1622 separated by second space 1626, and extending in a direction opposite to that of the first top fingers 1611 and 1612. The first top comb electrode 1610 is a signal electrode to which an electrical signal is applied, and the second top comb electrode 1620 is a ground electrode. The top electrode 1640 is interdigitated, forming a top interleaving pattern.

The LFE-CMR device 1600 includes the substrate 205 defining the cavity 208, the piezoelectric layer 1630 disposed on the substrate 205 over the cavity 208, a set of support pillars 1650 disposed on the piezoelectric layer 1630, and the top (contour) electrode 1640 disposed on the set of support pillars 1650. The set of support pillars 1650 includes support pillars 1651-1654, which provide intervening spaces 1656-1658, respectively. In an alternative embodiment, the cavity 208 may be replaced by an acoustic mirror, such as the DBR 270, to provide an acoustic resonator, without departing from the scope of the present teachings. As mentioned above, the LFE-CMR device 1600 includes no bottom metal, so there is not bottom electrode 1610, for example. As a result of this configuration (e.g., no floating bottom electrode 1610 or other metal layer between the piezoelectric layer 1630 and the substrate 205), application of the electrical signal to the first top fingers 1611 and 1612 excites the piezoelectric layer 1630 through lateral coupling, thus effectively resembling a SAW resonator. Notably, the presence of the cavity 208 prevents a pure surface wave from existing in the LFE-CMR device 1600. Instead, two Lamb modes exist, one with peak energy confined to the top surface of the piezoelectric layer 1630 and the other one with the peak energy confined to the bottom surface of the piezoelectric layer 1630. In LFE-CMR device 1600, the lateral electric field predominantly excites the Lamb mode with peak energy confined to the top surface of piezoelectric layer 1630 at frequencies close to the series resonance frequency Fs. However, some residual excitation of the Lamb mode with peak energy confined to the bottom surface of piezoelectric layer 1630 through the fringing electric field may be also possible.

Figure 17:
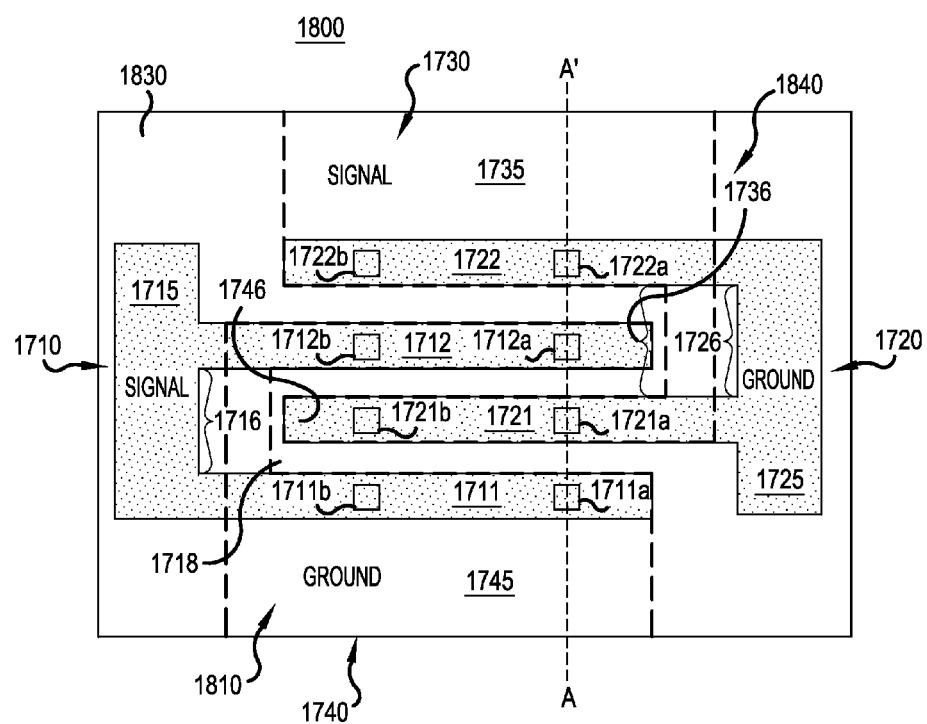
FIG. 17 is a top plan view of a TFE-CMR device with at least one set of supporting pillars, according to a representative embodiment.

FIG. 17 is a top plan view of a thickness-field-excitation (TFE) contour mode resonator (CMR) device with at least one set of supporting pillars, according to a representative embodiment, and FIGS. 18A-18D are cross-sectional views of the TFE-CMR device in FIG. 17 taken along a line A-A', according to different embodiments. More particularly, the cross-sectional views correspond to different variations of the TFE-CMR device 1800, respectively, as TFE-CMR devices 1800A-1800D, which may be referred to as CCEs. The TFE-CMR devices 1800A-1800D have many of the same features, so a repetitive description of these features may be omitted in an effort to avoid redundancy.

Referring to FIG. 17, TFE-CMR device 1800 includes a top electrode 1840 (or top contour electrode) comprising a first top comb electrode 1710 and second top comb electrode 1720. The first top comb electrode 1710 includes a first top bus bar 1715 and multiple representative first top fingers 1711 and 1712, separated by first space 1716. The second top comb electrode 1720 similarly includes a second top bus bar 1725 and multiple representative second top fingers 1721 and 1722, separated by second space 1726. The second top fingers 1721 and 1722 extend in the opposite direction as the first top fingers 1711 and 1712. The first top comb electrode 1710 is a top signal electrode to which an electrical signal is applied, and the second top comb electrode 1720 is a top ground electrode connected to ground. The top electrode 1840 is interdigitated, creating top interleaving pattern. The alternating first and second top fingers 1711, 1721, 1712 and 1722 are likewise separated by spaces or gaps 1718, respectively.

The TFE-CMR device 1800 further includes a bottom electrode 1810 (or bottom contour electrode) comprising a first bottom comb electrode 1730 and second bottom comb electrode 1740. The first bottom comb electrode 1730 includes a first bottom bus bar 1735 and at least one representative first bottom finger 1731, which is separated from the first bottom bus bar 1735 by first space 1736. The second bottom comb electrode 1740 similarly includes a second bottom bus bar 1745 and at least one representative second bottom finger 1741, which is separated from the second bottom bus bar 1745 by second space 1746. The second bottom finger 1741 extends in the opposite direction as the first bottom finger 1731. The first bottom comb electrode 1730 is a bottom signal electrode, and the second bottom comb electrode 1740 is a bottom ground electrode connected to ground. The bottom electrode 1810 is likewise interdigitated, creating a bottom interleaving pattern.

FIGS. 18A to 18D are cross-sectional diagrams, taken along line A-A' of FIG. 17, illustrating TFE-CMR devices, according to representative embodiments. Each of the TFE-CMR devices shown in FIGS. 18A to 18D includes a bottom contour electrode having a bottom interleaving pattern, thereby enabling thickness-field-excitation.

Figure 18A:
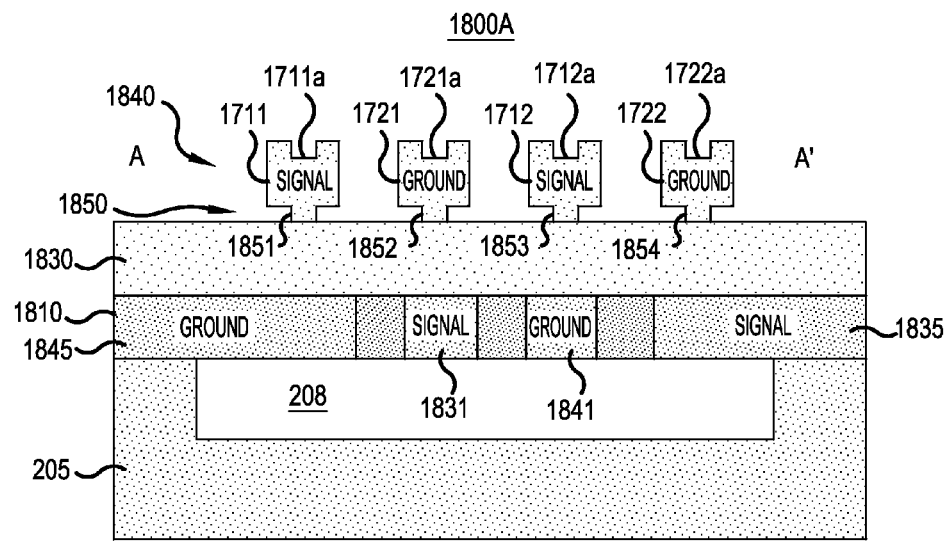
FIGS. 18A-18D are cross-sectional views of the TFE-CMR device in FIG. 17 taken along a line A-A', according to various representative embodiments.

Referring to FIG. 18A, TFE-CMR device 1800A includes substrate 205 defining a cavity 208, the bottom (contour) electrode 1810 disposed on the substrate 205 over the cavity 208, a piezoelectric layer 1830 disposed on the bottom electrode 1810, a set of support pillars 1850 disposed on the piezoelectric layer 1830 and the top electrode 1840 disposed on the set of support pillars 1850. (Although not shown, a planarization layer may be included adjacent the bottom electrode 1810, as needed, in this and the other embodiments.) The set of support pillars 1850 includes representative support pillars 1851-1854, which define air-gaps, indicated by representative air-gaps 1857-1858, separating the top electrode 1840 from and the piezoelectric layer 1830. The set of support pillars 1850 is substantially the same as the set of support pillars 1150, and is formed in substantially the same manner, as discussed above.

The first top comb electrode 1710 is a top signal electrode to which an electrical signal is applied, and the second top comb electrode 1720 is a top ground electrode. In addition, the first bottom comb electrode 1730 is another signal electrode, and the second bottom comb electrode 1740 is another ground electrode. Notably, in the depicted embodiment, the spaces between the first and second bottom bus bars 1735 and 1745 and the second and first bottom fingers 1741 and 1731 of the bottom electrode 1810 are respectively filled with a dielectric material (as opposed to being air spaces), such as NEBSG or non-conductive SiC, for example. These filled spaces include space 1733 between the second bottom bus bar 1745 and the first bottom finger 1731, space 1734 between the first and second bottom fingers 1731 and 2741, and space 1735 between the second bottom finger 1741 and the first bottom bus bar 1735. The first bottom finger 1731 is at least partially aligned with the second top finger 1721, and the second bottom finger 1741 is at least partially aligned with the first top finger 1712. However, the relative placements of the first and second bottom fingers 1731, 1741 and the first and second top fingers 1711, 1712, 2721, 2722, may vary without departing from the scope of the present teachings.

Figure 18B:
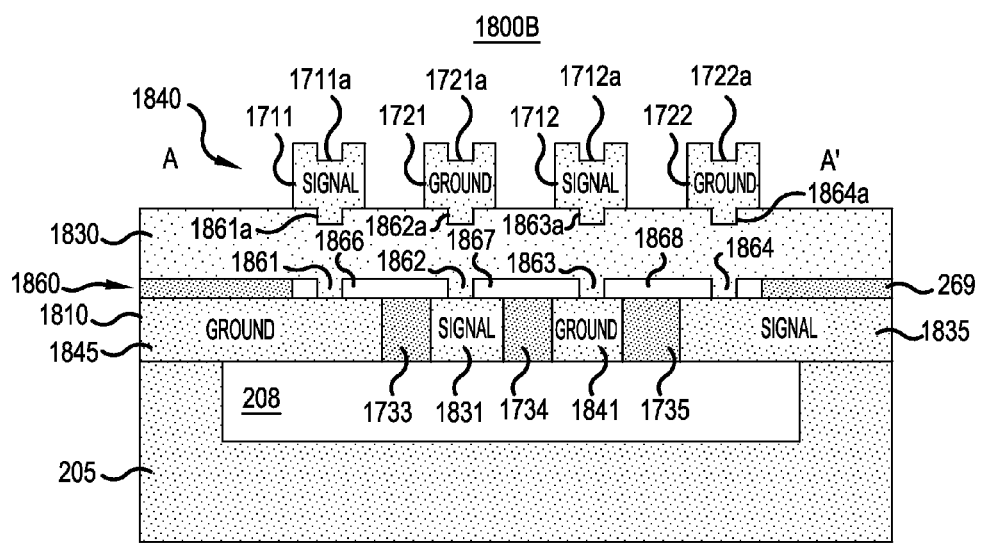

Referring to FIG. 18B, TFE-CMR device 1800B includes the substrate 205 defining the cavity 208, the bottom electrode 1810 disposed on the substrate 205 over the cavity 208, the set of support pillars 1860 disposed on the bottom electrode 1810, the piezoelectric layer 1830 disposed on the set of support pillars 1860, and the top electrode 1840 disposed on the piezoelectric layer 1830. The set of support pillars 1860 includes representative support pillars 1861-1864, which define air-gaps, indicated by representative air-gaps 1866-1868, separating the piezoelectric layer 1830 from the bottom electrode 1810. The set of support pillars 1860 is substantially the same as the set of support pillars 1160, and is formed in substantially the same manner, as discussed above. Again, the presence of the air-gaps 1866-1868 directly below the piezoelectric layer 1830 and above the bottom electrode 1810 may make the cavity 208 optional.

Figure 18C:
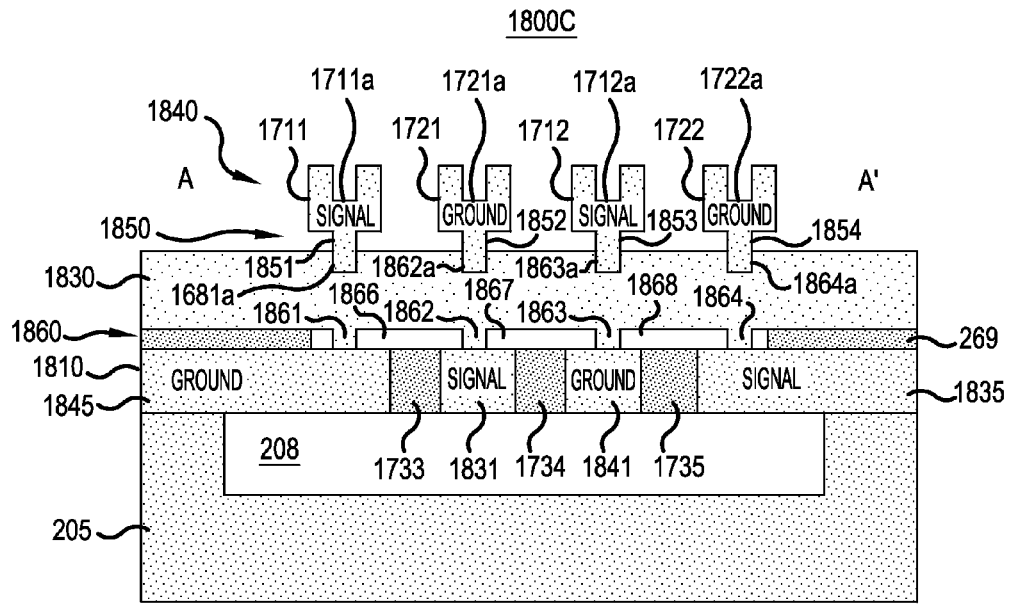
Figure 18D:
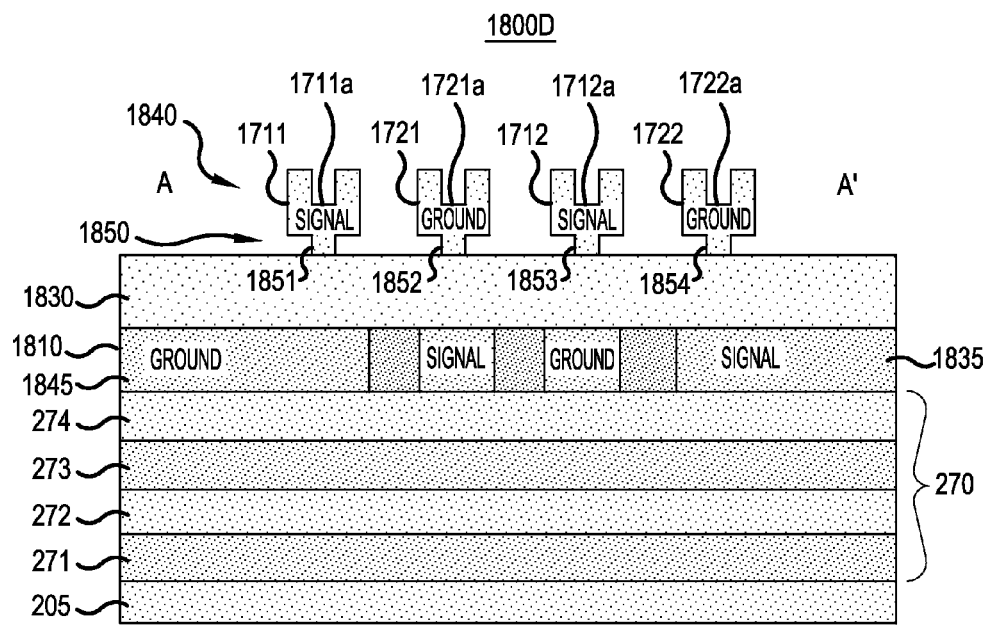

Referring to FIG. 18C, TFE-CMR device 1800C substantially combines the configurations of the TFE-CMR devices 1800A and 1800B. That is, the TFE-CMR device 1800C includes both the set of support pillars 1850 positioned between the piezoelectric layer 1830 and the top electrode 1840, and the set of support pillars 1860 positioned between the piezoelectric layer 1830 and the bottom electrode 1810. Referring to FIG. 18D, TFE-CMR device 1800D is substantially the same as TFE-CMR device 1800A, except that the acoustic reflector is implemented as an acoustic mirror, such as the representative DBR 270, as opposed to the cavity 208. The TFE-CMR device 1800D may also be referred to as a solidly mounted TFE-CMR. Of course, the DBR 270 may likewise be substituted for the cavity 208 in the TFE-CMR devices 1800B and 1800C, without departing from the scope of the present teachings.

In various alternative embodiments, the air-gaps between the piezoelectric layer and one or both of the top and bottom electrodes may be formed by alternative structures, other than a support frame defining air-gaps generally aligned or partially aligned with electrode fingers of top comb electrodes. For example, in various embodiments, at least one set of support pillars is positioned between the piezoelectric layer and the top electrode and/or positioned between the piezoelectric layer and the bottom electrode, where the at least one set of support pillars separates at least one of the top electrode and the bottom electrode from the piezoelectric layer, respectively, thereby defining corresponding air-gaps.

Generally, thin air-gaps and corresponding support structures may be placed in various alternative locations and configurations above and/or below the piezoelectric layer of an acoustic resonator to provide various CCR devices. The respective dimensions, materials, relative positioning, and so on, may be adjusted to achieve specific design objectives, such as target passband insertion loss frequencies in the case of LCRF devices, or resonant frequency, series resistance Rs, parallel resistance Rp, or electromechanical coupling coefficient $kt^2$ in the case of CMR devices.

While example embodiments are disclosed herein, one of ordinary skill in the art appreciates that many variations that are in accordance with the present teachings are possible and remain within the scope of the appended claims. For instance, as indicated above, the location, dimensions, materials and even numbers of frames can be variously altered. In addition, other features can be added and/or removed to further improve various performance characteristics of the described devices. These and other variations would become clear to one of ordinary skill in the art after inspection of the specification, drawings and claims herein. The invention therefore is not to be restricted except within the spirit and scope of the appended claims.

The invention claimed is:

1. A capacitive coupled resonator device, comprising:
    a substrate;
    a bottom electrode disposed over the substrate;
    a piezoelectric layer disposed over the bottom electrode;
    a top electrode disposed over the piezoelectric layer, the top electrode comprising:
        a first top comb electrode comprising a first top bus bar and a plurality of first top fingers extending in a first direction from the first top bus bar; and
        a second top comb electrode comprising a second top bus bar and a plurality of second top fingers extending in a second direction from the second top bus bar, the second direction being substantially opposite to the first direction such that the first and second top fingers form a top interleaving pattern; and
    at least one set of support pillars positioned between the piezoelectric layer and the top electrode and/or positioned between the piezoelectric layer and the bottom electrode, the at least one set of support pillars separating at least one of the top electrode and the bottom electrode from the piezoelectric layer, respectively, thereby defining corresponding air-gaps.

2. The capacitive coupled resonator device of claim 1, wherein the at least one set of support pillars comprises a set of top support pillars positioned between the piezoelectric layer and the top electrode, and no set of support pillars positioned between the piezoelectric layer and the bottom electrode.

3. The capacitive coupled resonator device of claim 2, wherein each top support pillar of the set of top support pillars is formed from material of the first top fingers or the second top fingers corresponding to the top support pillar, extending from the one of the first top fingers or the second top fingers to a top surface of the piezoelectric layer.

4. The capacitive coupled resonator device of claim 1, wherein the bottom electrode is disposed on an acoustic reflector comprising an air cavity formed in the substrate, and wherein the bottom electrode is disposed on the substrate over the air cavity.

5. The capacitive coupled resonator device of claim 1, wherein the bottom electrode is disposed on an acoustic reflector comprising a distributed Bragg reflector (DBR) disposed on the substrate, and wherein the bottom electrode is disposed on the DBR.

6. The capacitive coupled resonator device of claim 1, wherein the at least one set of support pillars comprises a set of bottom support pillars positioned between the piezoelectric layer and the bottom electrode, and no set of support pillars positioned between the piezoelectric layer and the top electrode.

7. The capacitive coupled resonator device of claim 6, wherein each bottom support pillar of the set of bottom support pillars is formed from material of the piezoelectric layer extending from the piezoelectric layer, in an area beneath one of the first top fingers or the second top fingers to a top surface of the bottom electrode.

8. The capacitive coupled resonator device of claim 6, wherein the bottom electrode is disposed on an acoustic reflector.

9. The capacitive coupled resonator device of claim 6, wherein the bottom electrode is disposed on the substrate, with no acoustic reflector.

10. The capacitive coupled resonator device of claim 1, wherein the at least one set of support pillars comprises both a set of top support pillars positioned between the piezoelectric layer and the top electrode, and a set of bottom support pillars positioned between the piezoelectric layer and the bottom electrode.

11. The capacitive coupled resonator device of claim 1, wherein the first top comb electrode is a signal electrode to which an electrical signal is applied, and the second top comb electrode is a floating electrode providing an output for the electrical signal, and
    wherein at least a portion of the bottom electrode is grounded, such that the capacitive coupled resonator device comprises a single-ended laterally coupled resonator filter (LCRF).

12. The capacitive coupled resonator device of claim 1, wherein the bottom electrode comprises:
    a first bottom comb electrode comprising a first bottom bus bar and at least one first bottom finger extending in a first direction from the first bottom bus bar; and
    a second bottom comb electrode comprising a second bottom bus bar and at least one second bottom finger extending in a second direction from the second bottom bus bar, the second direction being substantially opposite to the first direction such that the first and second bottom fingers form a bottom interleaving pattern, wherein the first top comb electrode is a signal electrode to which an electrical signal is applied, and the second top comb electrode is a floating electrode providing an output for the electrical signal, and wherein the first bottom comb electrode is a ground electrode, and the second bottom comb electrode is another floating electrode providing another output for the electrical signal, such that the capacitive coupled resonator device comprises a differential laterally coupled resonator filter (LCRF).

13. The capacitive coupled resonator device of claim 1, wherein the first top comb electrode is a signal electrode to which an electrical signal is applied, and the second top comb electrode is a ground electrode.

14. The capacitive coupled resonator device of claim 13, wherein the bottom electrode is floating, such that the capacitive coupled resonator device comprises a lateral-field-excitation (LFE) contour mode resonator (CMR).

15. The capacitive coupled resonator device of claim 13, wherein the bottom electrode comprises:
   a first bottom comb electrode comprising a first bottom bus bar and at least one first bottom finger extending in a first direction from the first bottom bus bar; and
   a second bottom comb electrode comprising a second bottom bus bar and at least one second bottom finger extending in a second direction from the second bottom bus bar, the second direction being substantially opposite to the first direction such that the first and second bottom fingers form a bottom interleaving pattern,
   wherein the first bottom comb electrode is another signal electrode, and the second bottom comb electrode is another ground electrode, such that the capacitive coupled resonator device comprises a thickness-field-excitation (TFE) contour mode resonator (CMR).

16. The capacitive coupled resonator device of claim 14, wherein the at least one set of support pillars comprises no support pillars positioned between the piezoelectric layer and the bottom electrode, and
   wherein the bottom electrode is disposed on a distributed Bragg reflector (DBR) disposed on the substrate, such that the capacitive coupled resonator device comprises a solidly mounted LFE CMR.

17. The capacitive coupled resonator device of claim 15, wherein the at least one set of support pillars comprises no support pillars positioned between the piezoelectric layer and the bottom electrode, and
   wherein the bottom electrode is disposed on a distributed Bragg reflector (DBR) disposed on the substrate, such that the capacitive coupled resonator device comprises a solidly mounted TFE CMR.

18. A resonator device, comprising:
   a bottom electrode disposed on over a substrate on an acoustic reflector;
   a piezoelectric layer disposed over the bottom electrode;
   a top electrode disposed over the piezoelectric layer, the top electrode comprising:
      a first top comb electrode comprising a first top bus bar and a plurality of first top fingers extending in a first direction from the first top bus bar; and
      a second top comb electrode comprising a second top bus bar and a plurality of second top fingers extending in a second direction from the second top bus bar, the second direction being substantially opposite to the first direction such that the first and second top fingers form a top interleaving pattern; and
   support pillars positioned between the piezoelectric layer and at least one of the bottom electrode and the top electrode, the support pillars defining at least one corresponding air-gap separating at least one of the bottom electrode and the top electrode from the piezoelectric layer, respectively.

19. A capacitive coupled resonator device, comprising:
   a substrate;
   a piezoelectric layer disposed over the substrate on an acoustic reflector; and
   a top electrode disposed over the piezoelectric layer, the top electrode comprising:
      a first top comb electrode comprising a first top bus bar and a plurality of first top fingers extending in a first direction from the first top bus bar; and
      a second top comb electrode comprising a second top bus bar and a plurality of second top fingers extending in a second direction from the second top bus bar, the second direction being substantially opposite to the first direction such that the first and second top fingers form a top interleaving pattern; and
   a support structure positioned between the piezoelectric layer and the top electrode, the support structure comprising at least one support pillar defining air-gaps separating the top electrode from the piezoelectric layer, the support structure being formed of a material of the top electrode,
   wherein the first top comb electrode is a signal electrode to which an electrical signal is applied, and the second top comb electrode is a ground electrode.

20. The capacitive coupled resonator device of claim 19, wherein the acoustic reflector comprises an air cavity formed in the substrate, and wherein the piezoelectric layer is disposed on the substrate over the air cavity.

21. The capacitive coupled resonator device of claim 19, wherein the acoustic reflector comprises a distributed Bragg reflector (DBR) disposed on the substrate, and wherein the piezoelectric layer is disposed on the DBR.

* * * * *